(12) United States Patent
Murakami et al.

(10) Patent No.: US 7,659,877 B2
(45) Date of Patent: Feb. 9, 2010

(54) SHIFT REGISTER AND DISPLAY DEVICE USING THE SAME

(75) Inventors: Yuhichiroh Murakami, Matsusaka (JP); Hajime Washio, Sakurai (JP); Sachio Tsujino, Matsusaka (JP); Seijirou Gyouten, Matsusaka (JP); Eiji Matsuda, Matsusaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 747 days.

(21) Appl. No.: 10/887,308

(22) Filed: Jul. 9, 2004

(65) Prior Publication Data

US 2005/0030276 A1 Feb. 10, 2005

(30) Foreign Application Priority Data

Jul. 9, 2003 (JP) .............................. 2003-194281
Jun. 28, 2004 (JP) .............................. 2004-189586

(51) Int. Cl.
G09G 3/36 (2006.01)
(52) U.S. Cl. ........................................ 345/100; 345/98
(58) Field of Classification Search ........... 345/98–100, 345/204, 205, 690; 327/33; 377/64, 78, 377/80
See application file for complete search history.

(56) References Cited

U.S. PATENT DOCUMENTS 5,450,024 A * 9/1995 Ruegg .......................... 326/66
6,870,895 B2 * 3/2005 Osame et al. .................. 377/78
6,897,839 B2 * 5/2005 Noguchi et al. ............... 345/82
2001/0011987 A1 * 8/2001 Kubota et al. .................. 345/98
2001/0043496 A1 11/2001 Cairns et al.
2002/0008695 A1 * 1/2002 Yamazaki et al. ........... 345/204
2002/0014905 A1 * 2/2002 Kumagai ..................... 327/333
2002/0047827 A1 * 4/2002 Koyama et al. ............. 345/100
2003/0174115 A1 9/2003 Washio et al.

FOREIGN PATENT DOCUMENTS

| EP | 1096467 A2 * | 5/2001 |
| JP | 5-216441 A | 8/1993 |
| JP | 2001-135093 A | 5/2001 |
| JP | 2001-307495 A | 11/2001 |

* cited by examiner

*Primary Examiner*—Amr Awad
*Assistant Examiner*—Michael Pervan
(74) *Attorney, Agent, or Firm*—Nixon & Vanderhye PC

(57) ABSTRACT

A shift register includes control circuits CNi (i=1 through n) corresponding to respective blocks, and a level shifter LSi+1 of the next stage is controlled by one of the outputs of the shift register and one of the outputs of flip-flops Fi. With this, a level shifter of the present stage operates only for a period minimum for outputting the shift output from the present block, so that the power consumption is reduced, Furthermore, it is possible to cause the outputs SL1 through SLn not to overlap each other.

14 Claims, 28 Drawing Sheets

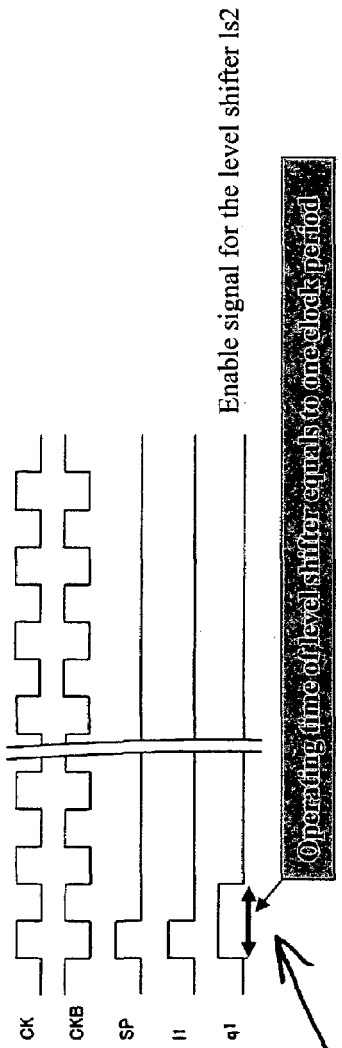
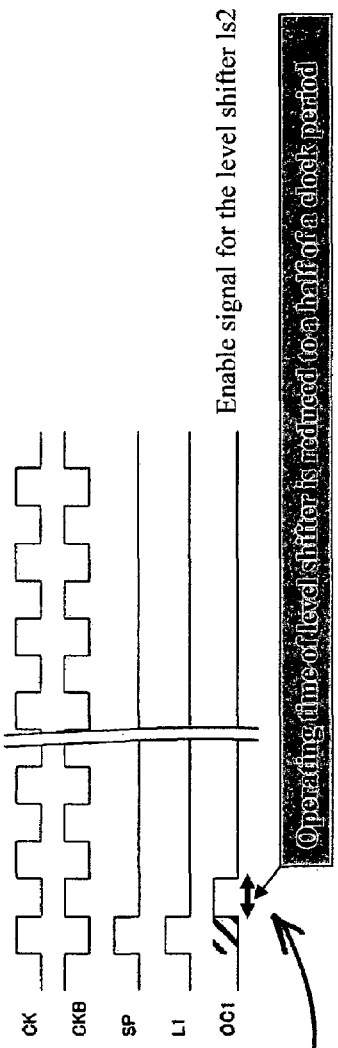

US 7,659,877 B2

SHIFT REGISTER AND DISPLAY DEVICE USING THE SAME

This Nonprovisional application claims priority under 35 U.S.C. § 119(a) on Patent Application No. 2003/194281 filed in Japan on Jul. 9, 2003 and Patent Application No. 2004/189586 filed in Japan on Jun. 28, 2004, the entire contents of which are hereby incorporated by reference.

FIELD OF THE INVENTION

The present invention relates to a shift register which is suitable for members such as a drive circuit of a liquid crystal display device and operates in response to an input signal which has a relatively low voltage, and a display device such as a liquid crystal display device, which adopts the shift register.

BACKGROUND OF THE INVENTION

For a scanning signal line drive circuit and a data signal line drive circuit of a liquid crystal display device, shift registers are broadly used for generating a scanning signal supplied to scanning signal lines and determining timing for sampling a data signal from a video signal. The electric power consumption of an electronic circuit increases in proportion to the frequency, load-carrying capacity, and second power of the voltage. Accordingly, a preset drive voltage of circuits including external circuits such as a circuit for generating a video signal supplied to a display panel tend to be lowered in order to reduce the power consumption.

However, in the cases of pixel circuits, a scanning signal line drive circuit, and a data signal line drive circuit which are formed by adopting polycrystalline silicon thin-film transistors in order to secure a large display area, the difference between threshold voltages sometimes reaches a few volts, between substrates or in one substrate. Taking this into consideration, the drive voltage includes a margin for canceling out the influence of the difference between the threshold voltages, so that there is still a room for the reduction of the drive voltage. In the meantime, circuits adopting single-crystal silicon transistors, such as a circuit for generating the video signal, generally have a drive voltage of 5V, 3.3V or lower.

For this reason, from an external circuit, such as the circuit for generating the video signal, to the display panel, a start pulse and a clock lower than the drive voltage of the shift register is supplied. In such a case, the shift register is provided with a level shifter for boosting the start pulse and clock.

To provide such a level shifter, for instance, Japanese Laid-Open Patent Application No. 2001-135093 (Tokukai 2001-135093; published on May 18, 2001) teaches that a start pulse is boosted by a level shifter and then supplied to a flip-flop of the first stage which is a part of the shift register, while a clock is boosted by the level shifter and then commonly supplied to flip-flops of all stages via buffers. In this case, the load on the occasion of driving the buffers equals to the total of the load of one clock line substantially identical in length with a side of the panel in the shifting direction, the load of the off-capacity of a transistor connected to said one clock line, and the like, so that the load is very heavy. Because of this heavy load, the clock supplied to the flip-flops of the respective stages of the shift register greatly delays. For this reason, the arrangement taught by the patent document cannot be used for high-frequency circuits, and hence generally used for low-frequency circuits such as a scanning line drive circuit.

Furthermore, in the aforesaid arrangement, the heavy load increases the power consumption. Thus, in high-frequency circuits such as a data signal line drive circuit, each flip-flop of the shift register is provided with a corresponding level shifter.

FIG. 18 is a block diagram showing circuitry of a shift register 1 which typifies the above-mentioned conventional art. The shift register 1 is disclosed by documents such as Japanese Laid-Open Patent Application No. 2000-339984 (Tokukai 2000-339984; published on Dec. 8, 2000, corresponding to US2003/0174115A1; published on Sep. 18, 2003) and Japanese Laid-Open Patent Application No. 2001-307495 (Tokukai 2001-307495; published on Nov. 2, 2001). The shift register 1 is basically made up of a shift register section 2 and a level shifter section 3. On the input sides of n-stage flip-flops f1, f2, ..., fn−1, and fn constituting the shift register section 2, level shifters ls1, ls2, ..., lsn−1, and lsn corresponding to the respective flip-flops are provided. On the output side of the flip-flop fn of the last stage, a level shifter lsn+1 is further provided. Furthermore, on the flip-flop f1 (first stage) side, a level shifter ls0 is provided on a stage before the level shifter ls1.

As a drive voltage of the shift register section 2, the level shifter ls0 generates a start pulse SPO, which is, for instance, boosted to about 15V, from a start pulse SP which is supplied from the circuit for generating the video signal and has an amplitude about 5V and an inversion signal SPB which is an inversion of the start pulse SP. In the level shifter section 3, the start pulse SPO is supplied to an enable terminal ENA of the level shifter ls1 corresponding to the flip-flop f1 of the first stage of the shift register section 2. To clock input terminals CK and CKB of the level shifter ls1, a clock signal CK which is supplied from the circuit for generating the video signal and has an amplitude about 5V and an inversion signal CKB which is an inversion of the clock signal CK are supplied, respectively. From an output terminal OUT of the level shifter ls1, the clock signal CK is outputted as long as the enable signal ENA is active HIGH.

An output signal l1 from the level shifter ls1 appears as an output to the outside of the shift register 1, inverted in an inverter invs1, and then supplied to a low-active set input terminal SB of the flip-flop f1 of the first stage. In this flip-flop f1, an output signal l3 is supplied from the level shifter ls3 which is two stages after the flip-flop f1 to a reset input terminal R of the flip-flop f1 so that the output signal l3 is reset, and an output signal q1 from an output terminal Q is supplied to an enable terminal ENA of the level shifter ls2 of the next stage.

In a similar manner, output signals l2 through ln from the respective level shifters ls2 through lsn appears as outputs to the outside of the shift register 1, inverted by respective inverters invs2 through invsn, and supplied to set input terminals SB of the corresponding flip-flops f2 through fn. The flip-flops f2 through fn−1 are reset by output signals l4 through ln+1 supplied from the level shifters ls4 through lsn+1 which are two stages after the respective flip-flops f2 through fn−1. From the output terminals Q of the flip-flops f2 through fn−1, output signals q2 through qn−1 are supplied to the enable terminals ENA of the level shifters ls3 through lsn which are the next stages of the respective flip-flops f2 through fn−1.

Note that, in the odd-stage level shifters ls1, ls3, ..., the clock signals CK and CKB are supplied to the clock input terminals CK and CKB, respectively. Meanwhile, in the even-stage level shifters ls2, ls4, ..., the clock signals CK and CKB are supplied to the clock input terminals CKB and CK, respectively. With this, the level shifters ls2 through lsn+1 carry out serial shifting at intervals of a half of the cycle of the clock signals CK and CKB.

The timing of the output signals l1 through ln from the respective level shifters ls1 through lsn is adjusted in the respective delay circuits d1 through dn in such a manner as to prevent the overlap of sampling pulses. Then the output signals l1 through ln appear as sampling pulses sl1 through sln, after passing through the buffers b1 through bn. With the help of these sampling pulses sl1 through sln, the scanning signal line drive circuit and the data signal drive circuit serially select the signal lines.

FIG. 19 show waveform charts for describing the operation of the aforesaid shift register 1. In accordance with the clock signals CK and CKB which are reverse-phased (180° out-of-phase) with each other, the start pulses SP each having the length half as much as the cycle of the clock signals CK and CKB are, as described above, serial-shifted by the flip-flops f1 through fn at intervals of a half of the cycle of the clock signals CK and CKB. As a result, the output signals l1 through ln are generated from the start pulses SP. Then, also as described above, the flip-flops f1 through fn−1 are reset by the output signals l3 through ln+1 supplied from the level shifters ls3 through lsn+1 which are two stages after the respective flip-flops f1 through fn−1. The flip-flop fn of the last stage is reset by the output signal ln+1 supplied from the level shifter lsn+1 which is one stage after the flip-flop fn. Furthermore, the level shifter lsn+1 of the last stage is reset in a short period by the output signal ln+1 from the level shifter lsn+1 itself, via the flip-flop fn of the previous stage.

In the shift register 1 being thus described, the flip-flops f1 through fn are set-reset flip-flops (SR-FF), and the positive-phase output signals q1 through qn from these flip-flops f1 through fn are used for controlling the operation of the level shifters ls2 through lsn+1 which are one stage after the respective flip-flops fn through fn. Thus, the level shifters ls2 through lsn+1 operate only when the output signals q1 through qn are active. As FIG. 19 shows, therefore, during the first half of the active period of each of the level shifters ls2 through lsn, the first half corresponding to a half of the cycle of the clock signals CK and CKB, the level shifters ls2 through lsn do not contribute to the shifting of the flip-flops f2 through fn (the shifting of the flip-flops f1 through fn−1 of the previous stages is realized if the output signals q1 through qn−1 are switched to be active before the timing at which the clock signals CK and CKB is switched to the next signals), so that the operation of the level shifters ls2 through lsn during the first half of the active period is redundant.

On the other hand, when the level shifters ls1 through lsn+1 are in operation, a stationary current flows in the level shifters ls1 through lsn+1, so that the level shifters ls1 through lsn+1 consume electric power. In case that the level shifters are a voltage-driven type, an input switching element to which the clock signal is supplied is turned on only when the supplied clock signal is active, so as to consume low amounts of power. However, the amplitude of the clock signal has to be higher than the threshold voltage of the input switching element, and this hampers the reduction of the power consumption. For this reason, the level shifters must be a current-driven type with which level-shifting of an input signal by which the input switching element is turned on/off is achieved without no hindrance, even if the amplitude of the input signal is lower than the threshold voltage of the input switching element, so that the input switching element to which the clock signal is supplied is always turned on when the level shifters are in operation, thereby consuming large amounts of power. As a result, the power consumption of a device including the shift register 1, e.g. a liquid crystal display device, is large, so that the battery power quickly burns in the cases of small portable devices and mobile phones, and hence the operating time of such devices is short.

Meanwhile, Japanese Laid-Open Patent Application No. 2001-356728 (Tokukai 2001-356728; published on Dec. 26, 2001, corresponding to US2001/0043496A1; published on Nov. 22, 2001) teaches in FIG. 21 that a clock signal is supplied to a gating circuit, and a signal level-shifted by the gating circuit is supplied to a flip-flop, so that an output pulse is fetched from the flip-flop. According to this document, when the length of the-output pulse from the flip-flop is equivalent to one pulse (a half of the cycle) of a clock signal, the operation time of the gating circuit is equivalent to one pulse of the clock signal. However, when the length of the output pulse is equivalent to not less than two pulses of the clock signal, the operation time of the gating circuit is also equivalent to not less than two pulses of the clock signal. In this manner, as the length of the output pulse increases, the power consumption of the gating circuit increases.

SUMMARY OF THE INVENTION

The objective of the present invention is to realize a shift register consuming lower amounts of power and a display device adopting the shift register.

To achieve this objective, the shift register of the present invention comprises a plurality of stages each including:

a flip-flop which is driven by a drive voltage higher than an amplitude of a clock signal, in order to serially transfer an input signal in sync with the clock signal;

a level shifter which level-shifts the clock signal or an inversion signal which is an inversion of the clock signal, and supplies the level-shifted signal to the flip-flop; and operation control means for controlling an operation time of the level shifter, at least an output signal or a signal which is an inversion of the output signal being supplied from the flip-flop of one stage to operation control means of another stage, so that the input signal is serially transferred, and in each of the stages, the operation. control means controls the operation time of the level shifter to be shorter than a cycle of the clock signal.

According to this arrangement, the operation control means, the level shifter whose operation time is controlled by the operation control means, and the flip-flop to which an output signal or an inversion signal which is an inversion of the output signal is supplied from the level shifter make up one stage. At least the output signal or the inversion signal thereof is supplied from the flip-flop to operation control means of a different stage, so that the input signal is serially transferred through the flip-flops. In doing so, as a pulse signal serially transferred to the stages, the output signal or the inversion signal thereof from the flip-flop is supplied to the outside of the shift register.

To adopt the output signal or the inversion signal thereof from the level shifter as a pulse signal supplied to the outside of the shift register, the operation time of the level shifter has to be not shorter than the pulse length of the pulse signal. Thus, if the pulse length is less than the cycle of the clock signal, the operation time of the level shifter can be shorter than the cycle of the clock signal. In other words, when the output signal or the inversion signal thereof from the level shifter is adopted as the pulse signal, the operation time of the level shifter is shorter than the cycle of a clock signal which is the shortest in the conventional art. For this reason, to generate, for instance, a pulse signal whose length is identical with the pulse length of the clock signal (i.e. a half of the cycle of the clock signal), the operation control means controls so as to cause the operation time of the level shifter to be identical with the pulse length of the clock signal. With this, the power consumption of the level shifter can be reduced.

When the output signal or the inversion signal thereof from the flip-flop is adopted as the pulse signal, the timing at which the output signal of the flip-flop falls can be arbitrarily determined once the output signal rises, and hence there is no need to keep the level shifter be operating. For this reason, the operation time of the level shifter is caused to be shorter than the cycle of the clock signal. That is to say, when the output signal or the inversion signal thereof from the flip-flop is adopted as the pulse signal whose pulse length is longer than the pulse length of the clock signal, the operation time of the level shifter in the conventional art is not shorter than the cycle of the clock signal. Meanwhile,. in the present invention, the operation time of the level shifter is shorter than the cycle of the clock signal irrespective of the length of the pulse signal. Thus, to generate, for instance, a sampling pulse whose pulse length is twice as much as the pulse length of the clock signal (i.e. equal to the cycle of the clock signal), the operation control means controls the operation time of the level shifter to include the timing at which the output signal from the flip-flop rises and to be shorter than the cycle of the clock signal, irrespective of the pulse length of the sampling pulse. With this, the power consumption of the level shifter can be reduced.

To achieve the foregoing objective, the display device of the present invention comprises scanning signal lines; data signal lines orthogonal to the respective scanning signal lines; and a scanning signal line drive circuit and a data signal line drive circuit which write video signals to pixel areas via the scanning signal lines and the data signal lines, respectively, so that an image is displayed, at least one of the scanning signal line drive circuit and the data signal line drive circuit including a shift register.

According to this arrangement, in a matrix display device which reproduces an image in such a manner that the pixel areas are formed by the scanning signal lines and the data signal lines orthogonal to the scanning signal lines and the scanning signal lines and the data signal lines are serially selected by the scanning signal line drive circuit and the data signal line drive circuit, at least one of the scanning signal line drive circuit or the data signal line drive circuit includes one of the aforesaid shift registers.

In this manner, a display device whose power consumption is reduced because of the reduction of the power consumption of the shift register is realized.

For a fuller understanding of the nature and advantages of the invention, reference should be made to the ensuing detailed description taken in conjunction with the accompanying drawings.

BRIEF DESCRIPTION OF THE DRAWINGS

FIG. 4 shows an waveform chart for illustrating the operation of the shift register in FIG. 1.

DESCRIPTION OF THE EMBODIMENTS

Embodiment 1

The following will describe an embodiment of the present invention with reference to FIGS. 1-11 and 20-23.

Figure 1:
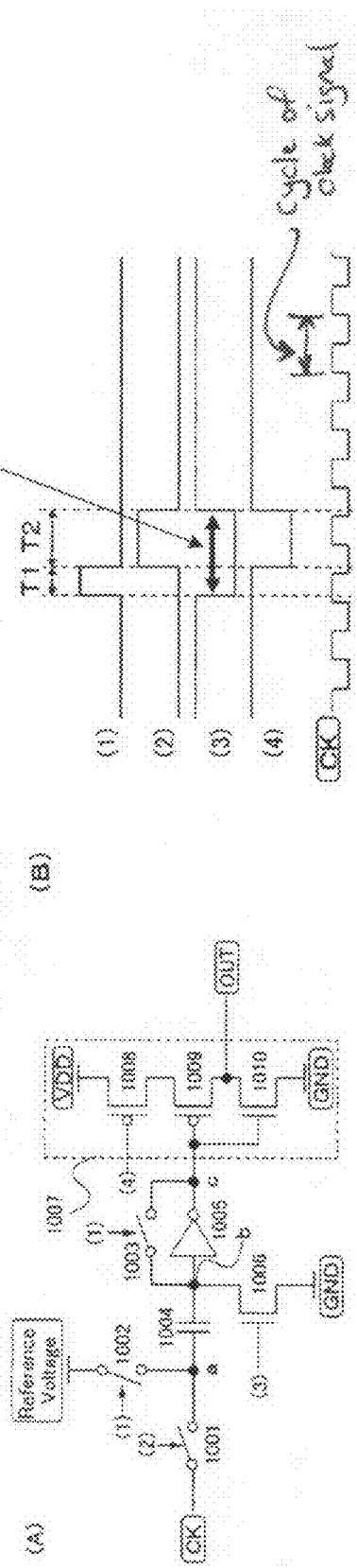
FIG. 1 is a block diagram showing circuitry of a shift register of an embodiment of the present invention.

FIG. 1 is a block diagram showing circuitry of a shift register 11 of the embodiment of the present invention. The shift register 11 is basically made up of a shift register section 12 and a level shifter section 13. On the input sides of n-stage flip-flops F1, F2, ..., Fn−1, and Fn constituting the shift register section 2, level shifters LS1, LS2, ..., LSn−1, and LSn corresponding to the respective flip-flops are provided. On the output side of the flip-flop Fn of the last stage, a level shifter LSn+1 is provided. Furthermore, on the flip-flop F1 (first stage) side, a level shifter LS0 is provided on a stage before the level shifter LS1.

As a drive voltage of the shift register section 12, the level shifter LS0 generates a start pulse SPO which is, for instance, boosted to about 15V, from a start pulse SP which is supplied from the circuit for generating the video signal and has an amplitude about 5V and an inversion signal SPB which is an inversion of the start pulse SP. In the level shifter section 13, the start pulse SPO is supplied to an enable terminal ENA of the level shifter LS1 corresponding to the flip-flop F1 of the first stage of the shift register section 12. To clock input terminals CK and CKB of the level shifter LS1, a clock signal CK which is supplied from the circuit for generating the video signal and has an amplitude about 5V and an inversion signal CKB which is an inversion of the clock signal CK are supplied, respectively. From an output terminal OUT of the level shifter LS1, the clock signal CK having been level-shifted is outputted when the enable signal ENA is active HIGH.

The output signal L1 from the level shifter LS1 appears as a signal supplied to the outside of the shift register 11, inverted by an inverter INVS1, and then supplied to a low-active set input terminal SB of the flip-flop F1 of the first stage. Therefore, in sync with the timing at which an inversion signal of the output signal L1 from the level shifter LS1 is set to HIGH, an inverted output signal QB1 from the flip-flop F1 is set to active LOW. To a reset input terminal R of the flip-flop F1, an output signal L3 is supplied from the level shifter LS3 which is two stages after the flip-flop F1, so that the flip-flop F1 is reset. From an inverted output terminal QB of the flip-flop F1, the inverted output signal QB1 is supplied to a control circuit CN1 of the present invention.

To the control circuit CN1, the inverted output signal QB1 and the output signal L1 are supplied from the flip-flop F1 and the level shifter LS1, respectively. In sync with the switching of the output signal L1 from active HIGH to non-active LOW, an output signal OC1 from the control circuit CN1 is set to active HIGH. Meanwhile, in sync with the switching of the inverted output signal QB1 of the flip-flop F1 from active LOW to non-active HIGH, the output signal OC1 is set to non-active LOW. The output signal OCi is supplied to the enable terminal ENA of the level shifter LS2 of the next stage. Thus, the level shifter LS2 operates during the output signal OC1 is active HIGH, and the level shifter LS2 causes the clock signal CKB to level-shift and supplies, as an output signal L2, the clock signal CKB from the output terminal OUT to the flip-flop F2 via an inverter INVS2. In this manner, the control circuit (operation control means) CN1 controls the operation time of the level shifter LS2 of the next stage. The control circuits CN2 through CNn also control the operation times of the respective level shifters of the next stages.

The processes from then on are similar to the above. That is, the output signals L2 through Ln from the respective level shifters LS2 through LSn appear as signals to be supplied to the outside of the shift register 11, inverted by the inverters INVS2 through INVSn, and then supplied to the set input terminals SB of the corresponding flip-flops F2 through Fn. The flip-flops F2 through Fn−1 are reset by the output signals L4 through Ln+1 from the level shifters LS4 through LSn−1 which are two stages after the respective flip-flops F2 through Fn−1. The inverted output signals QB2 through QBn−1 are supplied from the inverted output terminals QB of the flip-flops F2 through Fn−1 to the enable terminals ENA of the flip-flops F3 through Fn of the next stage, via the control circuits CN2 through CNn−1.

Note that, in the odd-stage level shifters LS1, LS3, ..., the clock signals CK and CKB are supplied to clock input terminals CK and CKB, respectively, while, in the even-stage level shifters LS2, LS4, ..., the clock signals CK and CKB are supplied to the clock input terminals CKB and CK, respectively. With this, the flip-flops F1 through Fn carry out serial shifting at intervals of a half of the cycle of the clock signals CK and CKB.

The output signals L1 through Ln from the level shifters LS1 through LSn appear as sampling pulses SL1 through SLn, after passing through buffers B1 through Bn. With the help of these sampling pulses SL1 through SLn, the scanning signal line drive circuit and the data signal line drive circuit serially select signal lines.

In the present embodiment, a level shifter LSk (k=2 through n), a control circuit CNk−1 which controls the operation time of the level shifter LSk, and a flip-flop Fk to which an inversion signal of an output signal Lk from the level shifter LSk is supplied make up one stage. The flip-flop Fk supplies an inverted output signal QBk to a control circuit CNk of a different stage, so that the start pulse SP or an inversion signal SPB which is an inversion of the start pulse SP is serially transferred through the flip-flops F1 through Fn. The operation times of the level shifters LSk (k=2 through n) are compared with the operation times of the conventional level shifters. The level shifters LS0, LS1, LSn+1, the flip-flop F1, and the control circuit CNn are circuits added to the level shifter, the flip-flop, and the control circuit of each stage, in order to complete the above-mentioned transfer. In FIG. 1, being dissimilar to the above-mentioned stage, the level shifter LSi, the flip-flop Fi, and the control circuit CNi (i=1 through n) appear to make up one stage. In this case, one block includes one flip-flop Fi, so that one block corresponds to one stage. Note that, in the present embodiment, instead of the inversion signals of the respective output signals L1 through Ln from the level shifters LS1 through LSn, re-inverted output signals from the flip-flops may be supplied to the flip-flops F1 through Fn. Furthermore, although in the present embodiment the control circuits CN1 through CNn receive the output signals LS1 through LSn (or inversion signals thereof) from the level shifters, the control circuit has to receive at least either a re-inverted output signal or an inverted output signal from the flip-flop.

Figure 2:
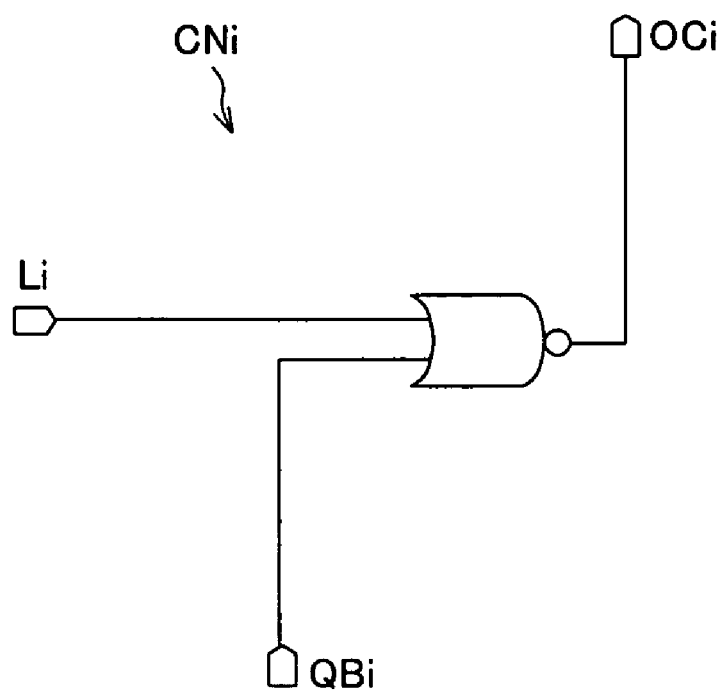
FIG. 2 shows how a control circuit of the shift register in FIG. 1 is structured.

FIG. 2 shows how the control circuits CN1 through CNn are structured. The control circuits CN1 through CNn (hereinafter, reference numbers such as 1, 2, ..., and n are appended if the order of members has to be clarified. To indicate a member of an arbitrary order, a reference number i is appended. If it is unnecessary to clearly show the order, reference numbers are omitted. Also, a character k is added to indicate a member in a particular stage) are identical to each other, and are NOR circuits as shown in FIG. 2. In the control circuit CNi, one input terminal receives an output signal Li from a level shifter LSi of the corresponding stage, the other input terminal receives an inverted output signal QBi from the flip-flop Fi of the corresponding stage, and an output signal OCi is supplied to the enable terminal ENA of the level shifter LSi+1 of the next stage.

Figure 3:
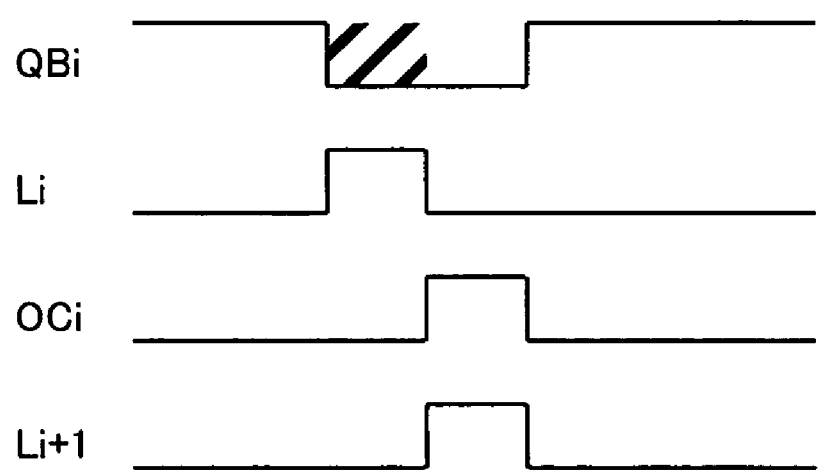
FIG. 3 shows an waveform chart for illustrating the operation of the control circuit in FIG. 2.

The NOR circuit outputs LOW when at least one of the inputs is HIGH. Meanwhile, the inverted output signal QBi from the flip-flop Fi is generated by causing the output signal Li from the level shifter LSi to be LOW-active. Therefore, as shown in FIG. 3, when the inverted output signal QBi from the flip-flop Fi and the output signal Li from the level shifter LSi are both LOW, the NOR circuit outputs a HIGH active output signal OCi. This output signal OCi is supplied to the level shifter LSi+1 of the next stage, so that an output Li+1 is outputted.

FIG. 4 is an waveform chart for illustrating the operation of the above-described shift register 11. As already described with reference to FIG. 19, in accordance with the clock signals CK and CKB which are reverse-phased (180° out-of-phase) with each other, the start pulse SP each having a cycle half as much as the cycle of the clock signals CK and CKB is serial-shifted by the flip-flops F1 through Fn at intervals of a half of the cycle of the clock signals CK and CKB. As a result, the output signals L1 through Ln are generated from the stark pulse SP. Then, also as described above, the flip-flops F1 through Fn−1 are reset by the output signals L3 through Ln+1 supplied from the level shifters LS3 through LSn+1 which are two stages after the respective flip-flops F1 through Fn−1. The flip-flop Fn of the last stage is reset by the output signal ln+1 supplied from the level shifter lsn+1 which is one stage after the flip-flop Fn. Furthermore, the level shifter LSn+1 of the last stage is reset in a short period by the output signal Ln+1 from the level shifter LSn+1 itself, via the flip-flop Fn of the previous stage.

Here, it should be noted that, in this shift register 11, the output signals OC1 through OCn from the respective control circuits CN1 through CNn allow the level shifters LS2 through LSn+1 of the next stages to operate only in periods in which the output signals L2 through Ln+1 are outputted in those next stages. That is to say, when the set input terminal SBi of the flip-flop Fi receives an active (LOW) signal, the inverted output signal QBi from the flip-fop Fi is in sync with the timing at which the input signal SBi is set to HIGH, so that the inverted output signal QBi is set to active (LOW). However, in the present embodiment, until the output signal Li of this stage is set to non-active (LOW) and the timing at which the level shifter LSi+1 starts to operate comes, the control circuit CNi keeps the output signal OCi to be non-active (LOW) and prohibit the operation of the level shifter LSi+1.

Figure 19:
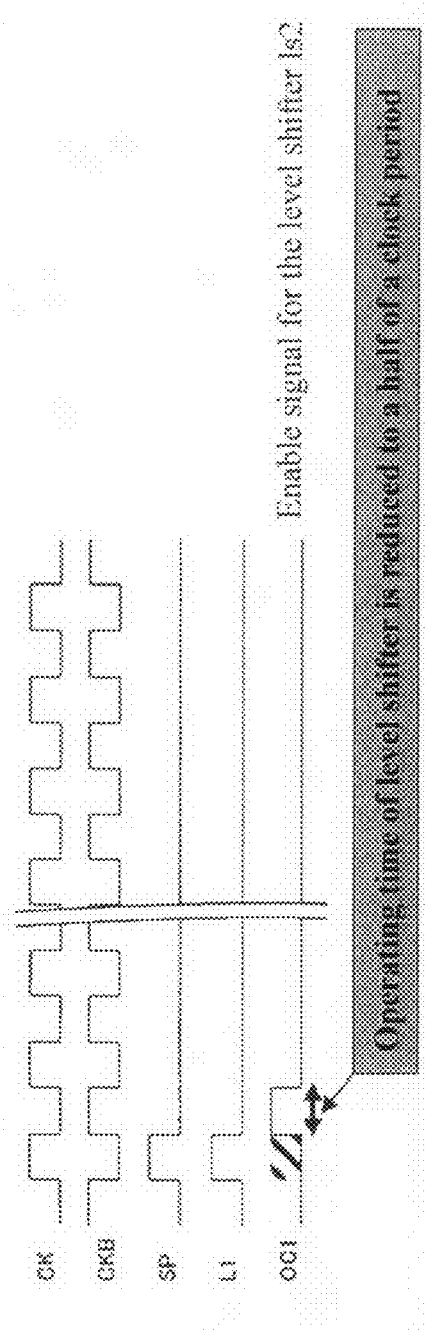
FIG. 19 shows an waveform chart for describing the operation of the shift register in FIG. 18.

With this, as the comparison with FIG. 19 clearly shows, in the present embodiment, the operation of the level shifters LS2 through LSn are stopped during periods indicated by oblique lines in FIG. 4 (i.e. a period corresponding to the pulse length of the clock signals CK and CKB, that is, a half of the cycle of the clock signals CK and CKB). Owing to this, the reduction of the power consumption is realized.

Note that, in the level shifters LS, the enable signal ENA is allowed to rise at any time during a period in which the clock signals CK and CKB are active (in the odd-stage level shifters LS1, LS3, . . . , the clock signal CK is HIGH while the clock signal CKB is LOW). Thus, the operation is successfully carried out on condition that the delay of the enable signal ENA is less than a half of the cycle of the clock signals CK and CKB.

In this manner, in each stage, the control circuit CNk−2 (k=2 through n) controls the operation time of the level shifter LSk to include the timing at which the output signal from the level shifter LSk rises and to be less than the cycle of the clock signals CK and CKB. The timing at which the output signal rises is the timing at which the pulse starts, and indicates both the timing at which the output signal rises to HIGH and the timing at which the output signal falls to LOW. The output signal (or its inversion signal) from the level shifter LSk in each stage is used as the pulse signals (sampling signal and scanning signal) supplied to the outside of the shift register 11, so that the operation time of the level shifter LSk has to be at least not shorter than the length of the pulse signal. Thus, when the length of the pulse is shorter than the cycle of the clock signals CK and CKB, the operation time of the level shifter LSk can be shorter than the clock signals CK and CKB. In other words, when the output signal (or its inversion signal) from the level shifter LSk is used as the pulse signal, the operation time of the level shifter LSk is shorter than the length of the shortest cycle of the clock signals CK and CKB of conventional art. For this reason, to generate, for instance, a pulse signal which is identical in length with the clock signals CK and CKB (i.e. a half of the cycle of the clock signals CK and CKB), the control circuit CNk−1 controls the operation time of the level shifter LSk to be identical with the pulse length of the clock signals CK and CKB. With this, the power consumption of the level shifter LSk can be reduced.

Note that, the level shifter LSn+1 does not belong to any stage or block from which the output signal is supplied to the outside of the shift register 11. However, as the waveform of the output signal OCn in FIG. 4 indicates, the operation time of this level shifter LSn+1 is shortened for the pulse length of the clock signals CK and CKB (i.e. a half of the cycle of the clock signals CK and CKB), compared to a case that the control circuit CNn is not provided. As to the level shifter LS1 which does not belong to any stage but to a block, the operation time thereof is also identical with the active period of the start pulse SP, so as to be shortened as much as the pulse length of the clock signals CK and CKB (i.e. a half of the cycle of the clock signals CK and CKB).

In this manner, a shift register consuming less amounts of electric power is realized.

Figure 5:
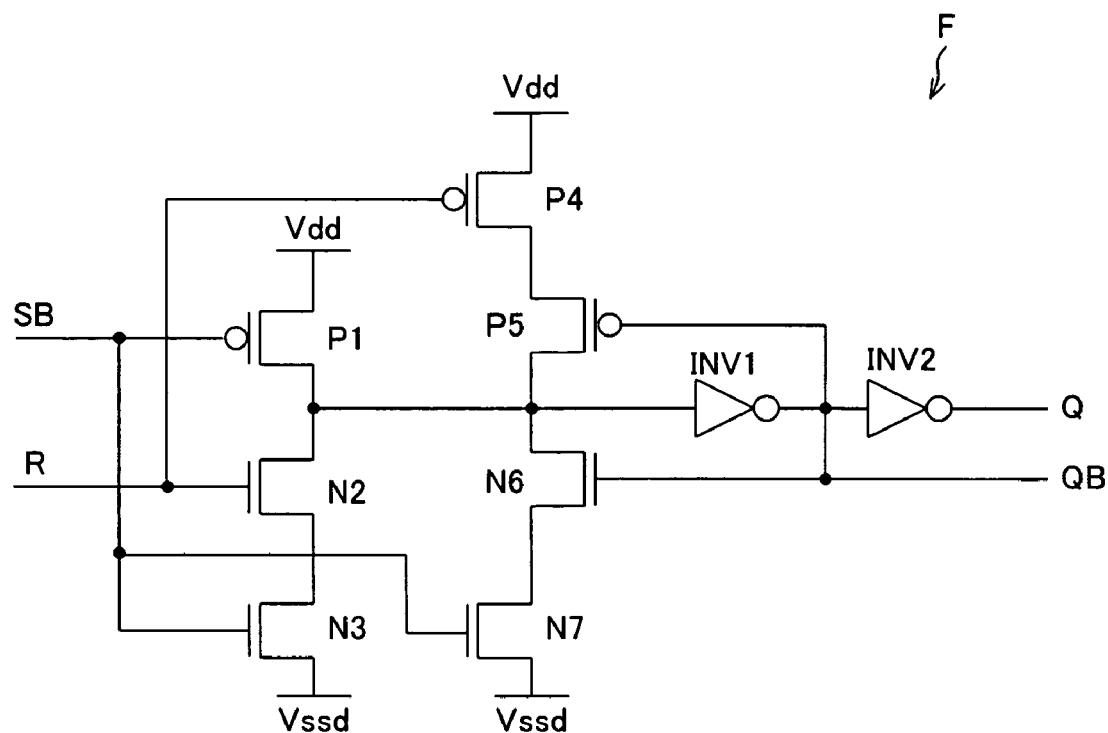
FIG. 5 is a block diagram showing an example of a flip-flop of the shift register in FIG. 1.

FIG. 5 is a block diagram showing an example of the aforesaid flip-flop F. Between a power supply line for a HIGH drive voltage Vdd and a power supply line for a LOW drive voltage Vssd, a P-type MOS transistor P1 and N-type MOS transistors N2 and N3 are provided in series with each other. The gates of the transistors P1 and N3 receive the LOW-active set signal SB, and the gate of the transistor N2 receives a HIGH-active reset signal R. Moreover, the drain voltage of the transistors P1 and N2 being connected to each other is inverted by the inverter INV1 so that the inverted output signal QB is produced, and then this inverted output signal QB is inverted again by the next inverter INV2, so that a re-inverted output signal Q is produced.

Furthermore, between the power supply lines, P-type MOS transistors P4 and P5 and N-type MOS transistors N6 and N7 are provided in series with each other. The drains of the transistors P5 and N6 are connected to the input to the inverter INV1, and to the gates of the transistors P5 and N6, the re-inverted output signal QB is fed back from the inverter INV1. The gate of the transistor P4 receives the reset signal R, and the gate of the transistor N7 receives the set signal SB.

Figure 6:
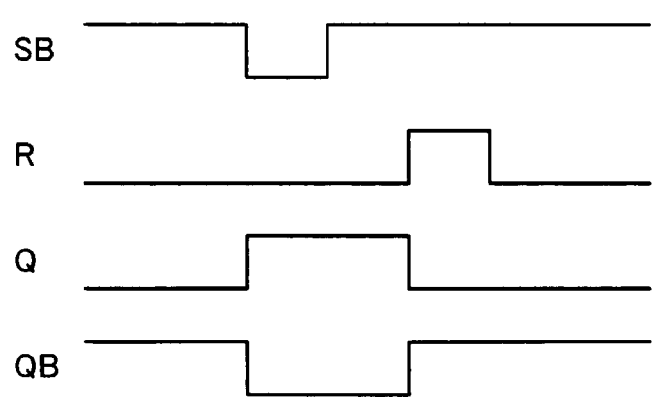
FIG. 6 shows an waveform chart for illustrating the operation of the flip-flop in FIG. 5.

Thus, as shown in FIG. 6, in the flip-flop F, when the set signal SB is switched to be active (LOW) while the reset signal R is non-active (LOW), the transistor P1 is turned on, causing the input of the inverter INV1 to be HIGH. With this, the re-inverted output signal Q is set to HIGH and the inverted output signal QB is set to LOW. In this state, the reset signal R and the inverted output signal QB from the inverter INV1 turn the transistors P4 and P5 on, so that the input to the inverter INV1 is kept to be HIGH. In the meantime, the reset signal R and the inverted output signal QB from the inverter INV1 turn the transistors N2 and N6 off. Thus, even if the set signal SB is switched to non-active (HIGH), the input to the inverter INV1 is kept to be HIGH, the re-inverted output signal Q is kept to be HIGH, and the inverted output signal QB is kept to be LOW.

Subsequently, when the reset signal R is switched to be active (HIGH), the transistor P4 is turned off while the transistor N2 is turned on. Since the set signal SB is kept to be non-active (HIGH), the transistor P1 is turned off while the transistor N3 is turned on. As a result, the input to the inverter INV1 is set to LOW, the re-inverted output signal Q is switched to LOW, and the inverted output signal QB is switched to be HIGH. In this manner, a set-reset flip-flop in which the LOW-active inverted output signal QB is set by the LOW-active set signal SB and the inverted output signal QB is reset by the HIGH-active reset signal R is realized.

Figure 7:
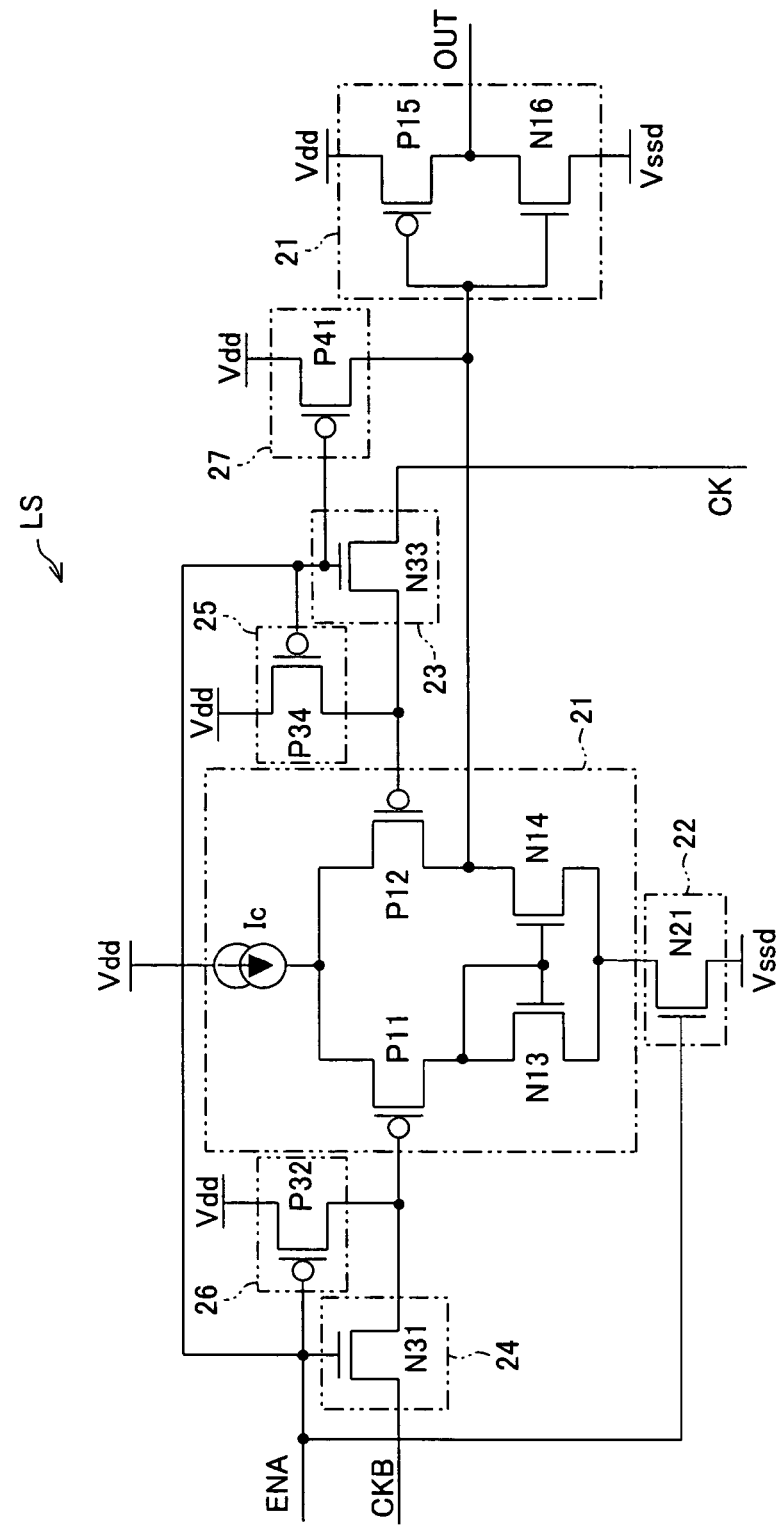
FIG. 7 is a block diagram showing an example of one level shifter of the shift register in FIG. 1.

FIG. 7 is an electrical diagram showing an example of the level shifter LS. This level shifter LS basically includes: a step-up/step-down transformer section 21 which causes the clock signals CK and CKB to level-shift; a power supply control section 22 which shuts off the power supply to the step-up/step-down transformer section 21, during a stop period in which the supply of the clock signals CK and CKB is unnecessary; input control sections 23 and 24 which causes the step-up/step-down transformer section 21 and the signal lines through which the clock signals CK and CKB are supplied to be shut off, during the stop period; input signal control sections 25 and 26 which causes input switching elements (P11 and P12) of the step-up/step-down transformer section 21 to be shut off, during the stop period; and an output stabilizing section 27 which keeps the output from the step-up/step-down transformer section 21 to be at a predetermined value.

The step-up/step-down transformer section 21 is a differential input pair on the input stage, and this step-up/step-down transformer section 21, P-type MOS transistors P11 and P12 which are the input switching elements and have sources connected to each other, and a stationary current source Ic which supplies a predetermined current to the sources of the transistors P11 and P12 constitute a current mirror circuit. The step-up/step-down transformer section 21 includes: N-type MOS transistors N13 and N14 connected to the respective drains of the transistors P11 and P12 so as to perform as active load; and CMOS transistors P15 and N16 which amplify the output of the differential input pair. FIG. 7 shows an odd-number level shifters LS1, LS3, . . . in each of which the output CK on the transistor P12 side is double-converted and outputted from the output OUT. Alternatively, in the case of even-number level shifters LS2, LS4, . . . , the input of the clock signal CK and the input of the clock signal CKB are interchanged.

To the gate of the transistor P11, the clock signal CKB is supplied via an N-type MOS transistor N31 which is a part of the input control section 24. To the gate of the transistor P12, the clock signal CK is supplied via an N-type MOS transistor N33 which is a part of the input control section 23. The gate of the transistor P11 is pulled up to a HIGH Vdd drive voltage running through the power supply line, via a P-type MOS transistor P32 which is a part of the input signal control section 26. Similarly, the gate of the transistor P12 is pulled up to the HIGH Vdd drive voltage running through the power supply line, via a P-type MOS transistor P34 which is a part of the input signal control section 25. The gates of the respective transistors N31, N33, P32, and P34 all commonly receive the enable signal ENA.

Therefore, when the enable signal ENA is set to active HIGH, the clock signals CKB and CK are allowed to enter the transistors P11 and P12 via the transistors N31 and N33, while the transistors P32 and P34 are turned off. Meanwhile, when the enable signal ENA is set to non-active LOW, the transistors N31 and N33 are turned off so as to inhibit the input of the clock signals CKB and CK, while the transistors P32 and P34 are turned on. Thus, the gates of the transistors P11 and P12 are pulled up to the HIGH Vdd, and hence the transistors P11 and P12 of the input stage are certainly turned off.

The gates of the transistors N13 and N14 are connected to each other, and also connected to the drains of the transistors P11 and N13. As an output terminal, the drains of the transistors P12 and N14, which are connected to each other, are connected to the gates of the transistors P15 and N16. The sources of the transistors N13 and N14 are connected to the power supply line through which a LOW Vssd drive voltage runs, via an N-type MOS transistor N21 which is a part of the power supply control section 22. The gate of the MOS transistor N21 receives the enable signal ENA.

Thus, when the enable signal ENA is set to active HIGH, the step-up/step-down transformer section 21 receives power via the transistor N21. When the enable signal is set to non-active LOW, meanwhile, the power supply to the step-up/step-down transformer section 21 is stopped.

The output stabilizing section 27 stabilizes the output signal OUT of the level shifter LS to be at the level of the LOW Vssd drive voltage, during the stop period. The gate of the output stabilizing section 27 receives the enable signal ENA, and the output signal stabilizing section 27 is made up of a P-type MOS transistor P41 which causes the gates of the transistors P15 and P16 to pull-up to the HIGH Vdd drive voltage running through the power supply line.

In the level shifter LS being thus described, the transistors N21, N31, and N33 are turned on while the transistors P32, P34, and P41 are turned off, when the enable signal ENA instructs operation (i.e. the signal is HIGH). In this state, the current from the stationary current source Ic passes through either the transistors P11 and N13 or the transistors P12 and N14, and then passes through the transistor N21. The gates of the transistors P12 and P11 receive the clock signals CK and CKB, respectively. As a result, the gates of the transistors P11 and P12 receive currents each corresponding to the ratio of the voltage between the gate and source. Meanwhile, since the transistors N13 and N14 perform as active load, the voltage at the junction between the transistors P12 and N14 corresponds to the voltage level difference between the clock signals CK and CKB. This voltage at the junction is amplified by the transistors P15 and N16, and then outputted as the output signal OUT.

Being different from a voltage-driven type, i.e. such a type that the transistors P12 and P11 on the input stage are switched by the clock signals CK and CKB, the step-up/step-down transformer section 21 is a current-driven type, so that the transistors P12 and P11 on the input stage are always turned on. Therefore, as described above, the current from the stationary current source Ic is shunted in accordance with the ratio of the voltage between the gate and source in the transistors P12 and P11, so that the clock signals CK and CKB are successfully level-shifted, even if the amplitudes of the clock signals CK and CKB are lower than the threshold values of the transistors P12 and P11 on the input stage.

As a result, when the enable terminals ENA of the level shifters LS2 through LSn+1 receive respective active HIGH output signals OC1 through OCn from the control circuits CN1 through CNn, even if the amplitudes of the clock signals CK and CKB are lower than the difference between the drive voltage on the HIGH side and the drive voltage on the LOW side (difference Vcc=Vdd−Vssd, e.g. about 15V, (for instance, even if the amplitude are about 5V from the circuit for generating the video signal,) the level shifters LS2 through LSn+1 output the output signals OUT each being stepped up or stepped down to the difference Vcc.

On the contrary, when the enable signal ENA is non-active LOW so as to instruct deactivation, the current supplied from the stationary current source Ic either via the transistors P11 and P13 or via the transistors P12 and N14 is shut off by the transistor N21. The power consumption is thus reduced for the current from the stationary current source Ic.

Furthermore, in this state, the transistors N23 and N31 of the respective input control sections 23 and 24 are turned off, separating the signal lines supplying the clock signals CK and CKB from the gates of the transistors P12 and P11 on the input stage. When deactivated, the transistors P34 and P32 of the respective input signal control sections 25 and 26 are turned on. Thus, the gate voltages of the transistors P11 and P12 are both pulled up to the HIGH drive voltage Vdd, so that the transistors P11 and P12 are turned off. With this, as in the case that the transistor N21 is turned off, the transistor N21 is turned off, and the power consumption is reduced for the current outputted from the stationary current source Ic.

However, in this state, no current is supplied to the transistors P11 and P12, so that the transistors P11 and P12 cannot operate as a differential input pair, and hence the voltage at the output terminal, i.e. at the junction of the drains of the transistors P12 and N14 is indeterminable. On this account, the transistor P41 of the output stabilizing section 27 is further turned on when the enable signal ENA indicates deactivation. As a result, the voltage at the output terminal, i.e. at the gates of the transistors P15 and N16 is pulled up to the HIGH drive voltage Vdd, the transistor N16 is turned on, and the output signal OUT is set to LOW.

In this manner, when the enable signal ENA, i.e. the output signal OCi-1 from the control circuit CNi-1 of the previous stage indicates deactivation, the output signal OUTi from the level shifter LSi, i.e. the output signal Li is kept to LOW irrespective of the clock signals CK and CKB. This prevents the malfunction of the flip-flop F and the output signal Li when, for instance, the output signal OUT becomes unstable while the level shifter LS is stopped, so that stable operation is realized.

Figure 8:
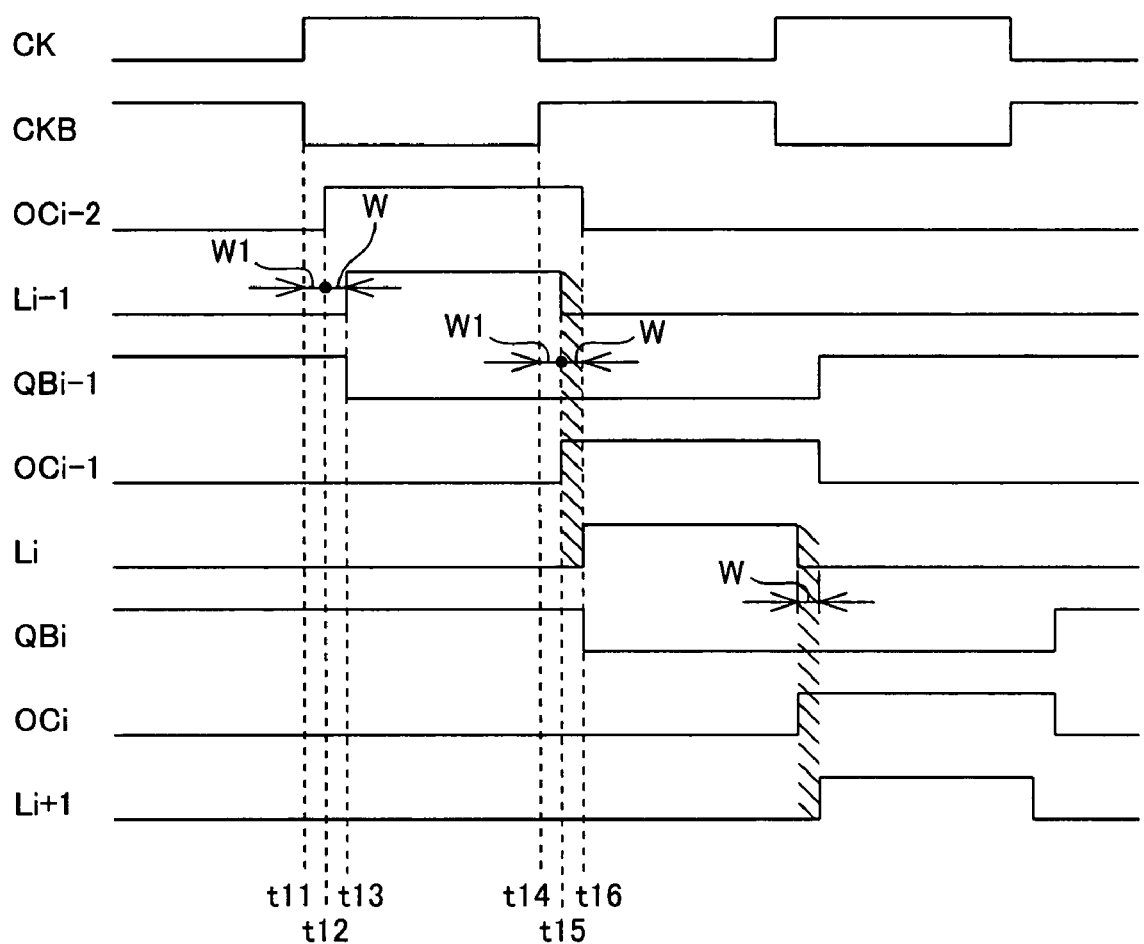
FIG. 8 is a timing chart for describing the operation of the control circuit in detail.

FIG. 8 is a timing chart for describing the operation of the control circuit CN in detail. The clock signals CK and CKB are switched at a time t11. When the output signal OCi-2 is set to active at a time t12, the level shifter LSi-1 of the next stage sets the output signal Li-1 to be active, at a time t13 which delays for W minutes (delay time), which is the delay in the level shifter LSi-1, from the timing at which the output signal OCi-2 is set to active. This output signal Li-1 from the level shifter LSi-1 sets the flip-flop Fi-i, so that the output QBi-1 from the flip-flop Fi-i is set to active and supplied to the control circuit CNi-1.

However, the control circuit CNi-1 is not set since the output signal Li-1 is active HIGH. When the clock signals CK and CKB are switched at a time t14, the output signal Li-1 is set to non-active at a time t15 which is after the time t14, and the output signal OCi-1 is set to active. As a result, the level shifter LSi of the next stage is activated. The timing at which the output signal OCi-1 is set to active is delayed because the timing at which the output signal Li-1 is set to non-active is delayed for an amount equivalent to the delay in the level shifter LSi-1, from the timing at which the output signal Li-1 is set to non-active.

Thus, from the level shifter LSi, the output signal Li can be outputted as an active signal, from a time t15 at which the output signal OCi-1 from the control circuit Cni-1 is set to active. However, the timing at which the output signal Li is set to active is delayed for the delay time W in the level shifter LSi, so that the output signal Li is set to active at a time t16.

The remaining level shifters and flip-flops also carry out the output in a similar manner. Focusing again on the output signal Li from the level shifter LSi in FIG. 8, the time lengths between the pulse of the output signal Li and pulses of the output signals Li-1 and Li+1 are equivalent to the shaded areas in FIG. 8. In this manner, the output pulses not overlapping each other can be generated. Therefore, when such pulses are utilized as signals for sampling, it is possible to prevent a wrong video signal from being written into a data signal line, which is caused by the great variation of the video signal due to the overlapping of pulses. Furthermore, when the pulses are used as scanning signals, processes for, for instance, refreshing a video signal on the data signal line can be realized.

Figure 18:
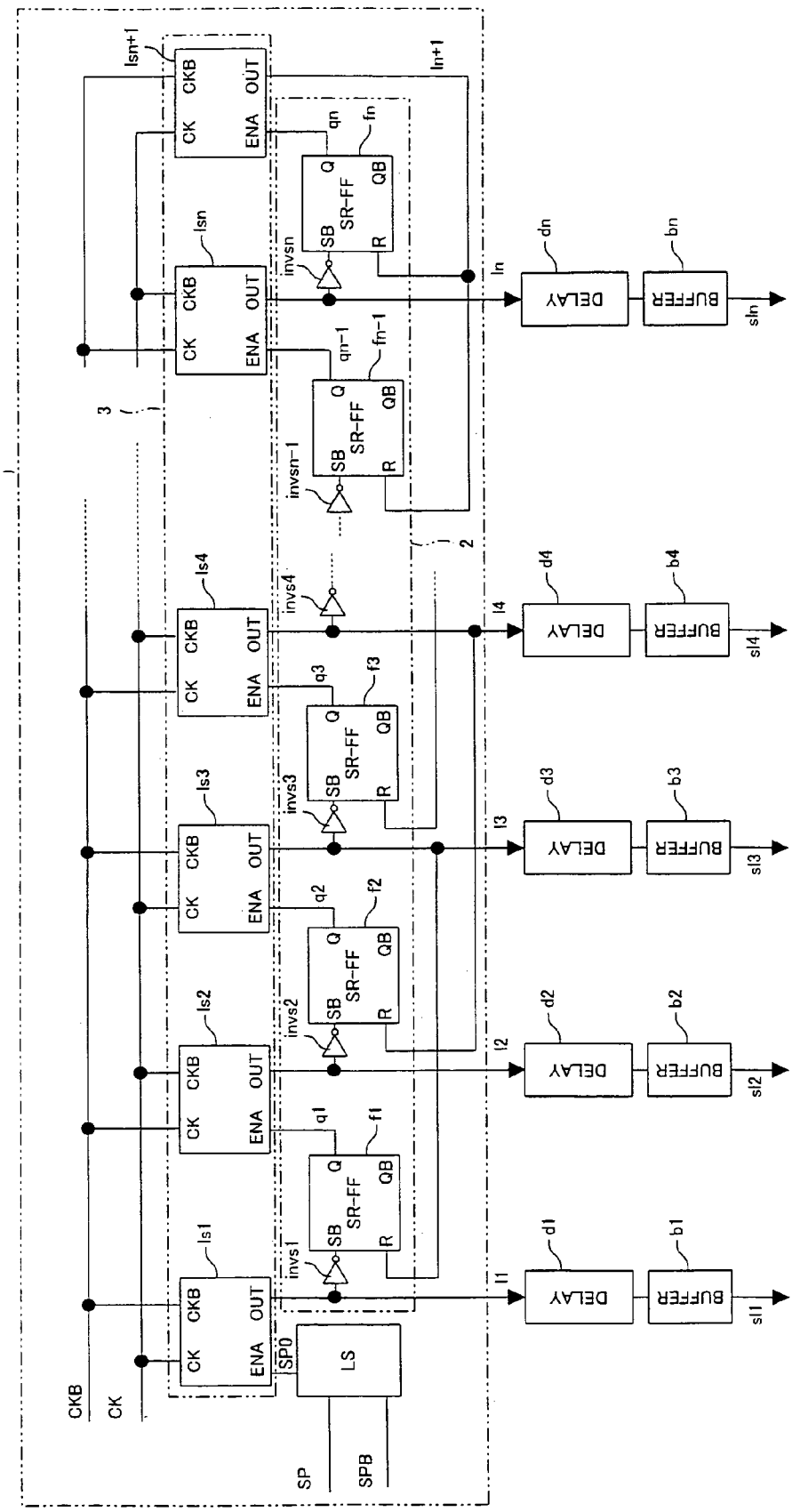
FIG. 18 is a block diagram showing circuitry of a typical shift register of conventional art.
Figure 20:
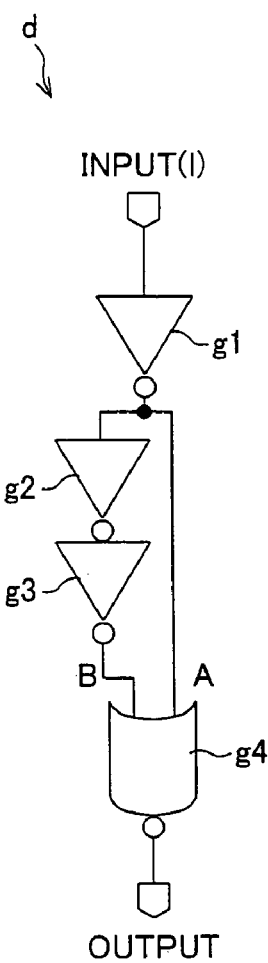
FIG. 20 is a block diagram showing an example of a delay circuit of the shift register in FIG. 18.

Note that, in the shift register 1 shown in FIG. 18, delay circuits d1 through dn are provided between the outputs OUT from the level shifters ls1 through lsn and the buffers b1 through bn, in order to cause the pulses not to overlap each other as above. FIG. 20 is a block diagram showing an example of the delay circuit d. The delay circuit d is made up of three-stage inverters g1 through g3 and a NOR circuit g4. An output signal 1 from the level shifter ls is inverted by the inverter g1, and then supplied to (i) one input A of the NOR circuit g4 and (ii) the other input B of the NOR circuit g4 via the two-stage inverters g2 and g3. As described above, the NOR circuit g4 operates in such a manner as to output LOW when at least one of the inputs is HIGH.

Figure 21:
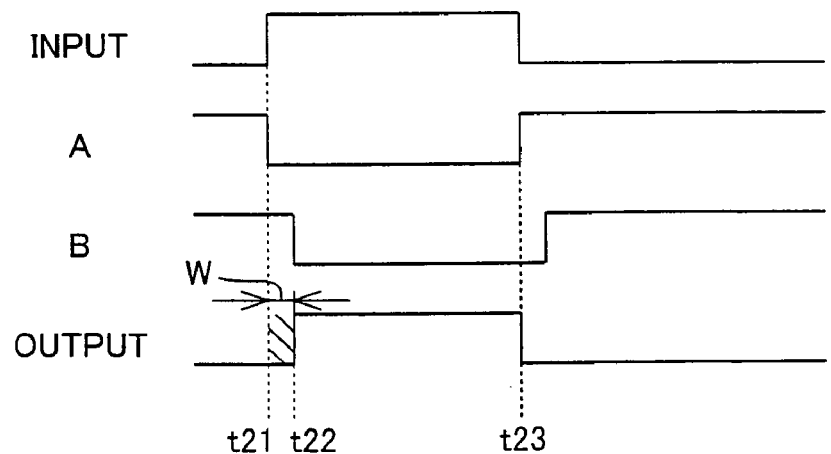
FIG. 21 is a timing chart for describing the operation of the delay circuit in FIGS. 20.

Thus, as shown in FIG. 21, when the output signal 1 supplied from the level shifter ls to the delay circuit d is set to active HIGH at a time t21, the outputs A and B from the NOR circuit g4 are both set to LOW so that the NOR circuit g4 starts to output active HIGH from a time t22 which is after the delay time W in the inverters g2 and g3. When the output signal 1 is set to non-active LOW at a time t23, the input A is set to HIGH so that the output is set to non-active LOW. Thus, the pulse width of the output signal 1 from the level shifter ls is narrowed for the delay time W shown as a shaded area in FIG. 21.

Figure 22:
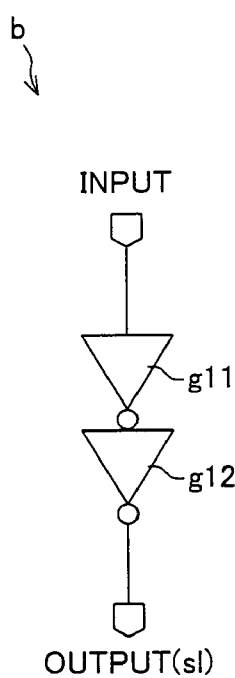
FIG. 22 is a block diagram showing an example of a buffer in the shift register in FIG. 18.
Figure 23:
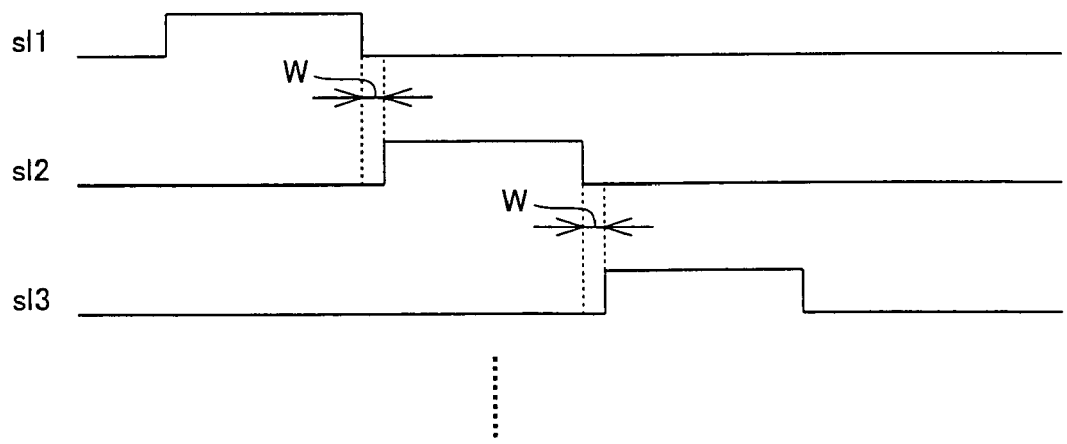
FIG. 23 shows an waveform chart for illustrating the operation of the buffer in FIG. 22.

Meanwhile, as shown in FIG. 22, the buffer b is made up of two-stage inverters g11 and g12, so that the output signals sl1 through sln from the respective buffers b1 through bn appear, as shown in FIG. 23, as pulses at intervals of the delay time W, so that the pulses are not overlapped with each other as described above.

Since the control circuit CN for causing the operation time of the level shifter LS to be minimum is provided, it is unnecessary to provide the delay circuit d which sets the delay time W and causes the pulses of the output signal L not to be overlapped with each other. With this, the drive circuit is simplified and the frame of the display panel is narrowed down.

Incidentally, in the present invention, the delay circuit d is unnecessary while the control circuit CN is provided. Comparing these circuits, assuming that the delay circuit d is made up of two inverters and a NOR circuit as shown in FIG. 18, the number of transistors is 8 (2 in the CMOS inverters×2 stages +4 in the NOR circuit). On the other hand, as shown in FIG. 2, the control circuit CN is made up of a NOR circuit, and hence the number of transistors is 4. In the control circuit CN, the output from the flip-flop F is fed back, so that the widths of the wires has an effect. However, in general, a delay circuit for causing delay has to have large inverters (g2 and g3 in FIG. 20) so as to require a large area. Thus, even if the width of the wires is taken into consideration, the frame can still be narrowed down as above.

Note that, instead of the output supplied from the level shifter to the control circuit CN, which is eventually supplied to the outside of the shift register, the output from one of the circuits after the circuit supplying the output to the outside of the shift register may be used for delaying the output supplied to the outside of the shift register. For instance, in the cases of sampling signals and scanning signals, a time at which the output signal supplied to the outside of the shift register is set to active is determined with reference to the timing at which the last output from the previous stage is set to active. With this, the signals are certainly not overlapped with the outputs to the outside from the previous stage and the next stage, and it is unnecessary to provide delay circuits in stages after the circuit for supplying the output to the outside of the shift register. Thus, the frame of the display panel is narrowed down by simplifying the drive circuit. This arrangement is easily realized only by modifying the input to the control circuit CN.

Figure 9:
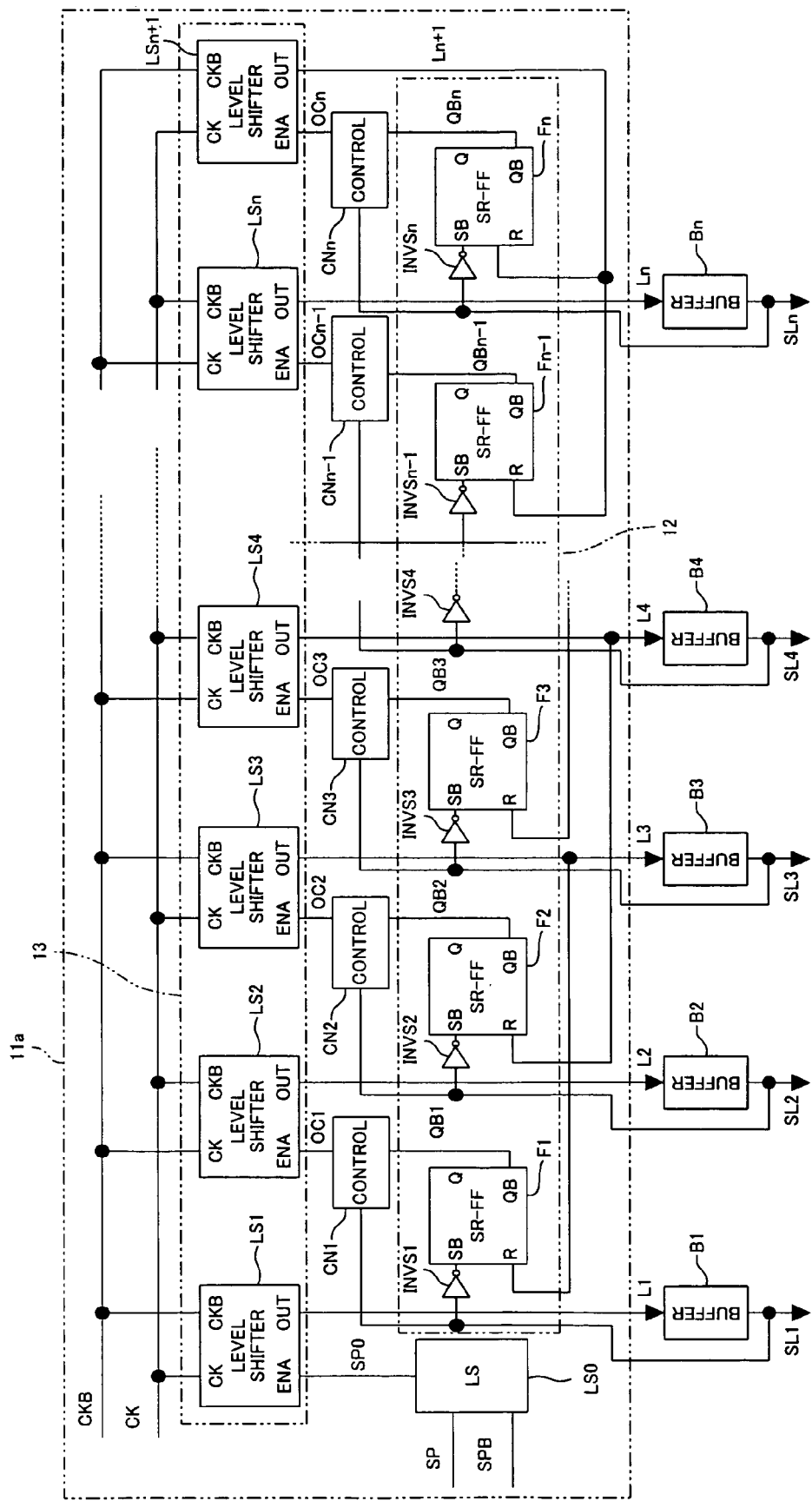
FIG. 9 is a block diagram showing another example of the shift register in FIG. 1.

FIG. 9 is a block diagram showing circuitry of a shift register 11a indicating another example of the input to the control circuit CN. This shift register 11a is similar to the shift register 11 in FIG. 1, members having the same functions as those described above are given the same numbers, so that the descriptions are omitted for the sake of convenience. In this shift register 11a, an output SLi is supplied from a buffer Bi to the control circuit CNi and the inverter INVSi connected to the set input terminal SB of the flip-flop Fi. The width of the pulses can be further widened by increasing the number of the stages of the buffers B.

Figure 10:
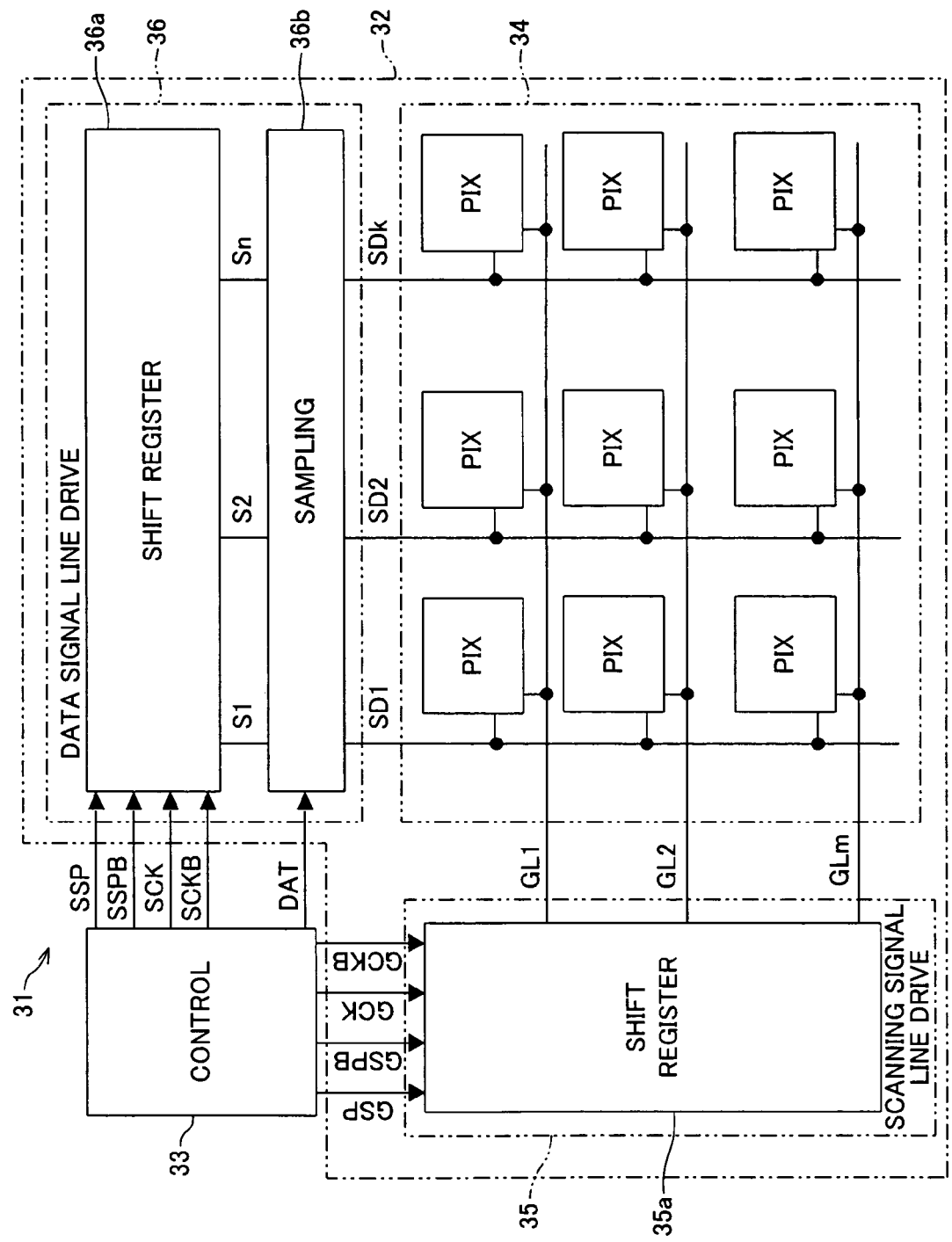
FIG. 10 is a block diagram of an image display device which exemplifies suitable use of the shift register of the present invention.

The shift register 11 being thus arranged can be widely used as shift registers in which the amplitude of an input signal is lower than a drive voltage. As a preferable example, the following will discuss such a case that the shift register 11 is adopted to an image display device. FIG. 10 is a block diagram of an image display device 31. This image display device 31 is basically arranged such that a control circuit 33 for generating a video signal DAT is mounted on a display panel 32. The display panel 32 includes: a display section 34 including pixels PIX disposed in a matrix manner; and a scanning signal line drive circuit 35 and a data signal line drive circuit 36 which drive the pixels PIX. The scanning signal line drive circuit 35 is made up of a shift register 35a while the data signal line drive circuit 36 is made up of a shift register 36a and a sampling circuit 36b. At least either one of these shift registers 35a and 36a is the aforesaid shift register 11.

The display section 34 and the drive circuits 35 and 36 are monolithically formed on one substrate, in order to simplify the manufacturing process and reduce the capacity of lines. To integrate a great number of pixels PIX so as to increase the size of the display area, the display section 34 and the drive circuits 35 and 36 are made up of members such as polycrystalline silicon thin-film transistors formed on a glass substrate. The polycrystalline silicon thin-film transistors are manufactured at a process temperature of not more than 600° C., in order to avoid warpage and flexure even if a typical glass substrate whose distortion point is not more than 600° C. is adopted.

Figure 11:
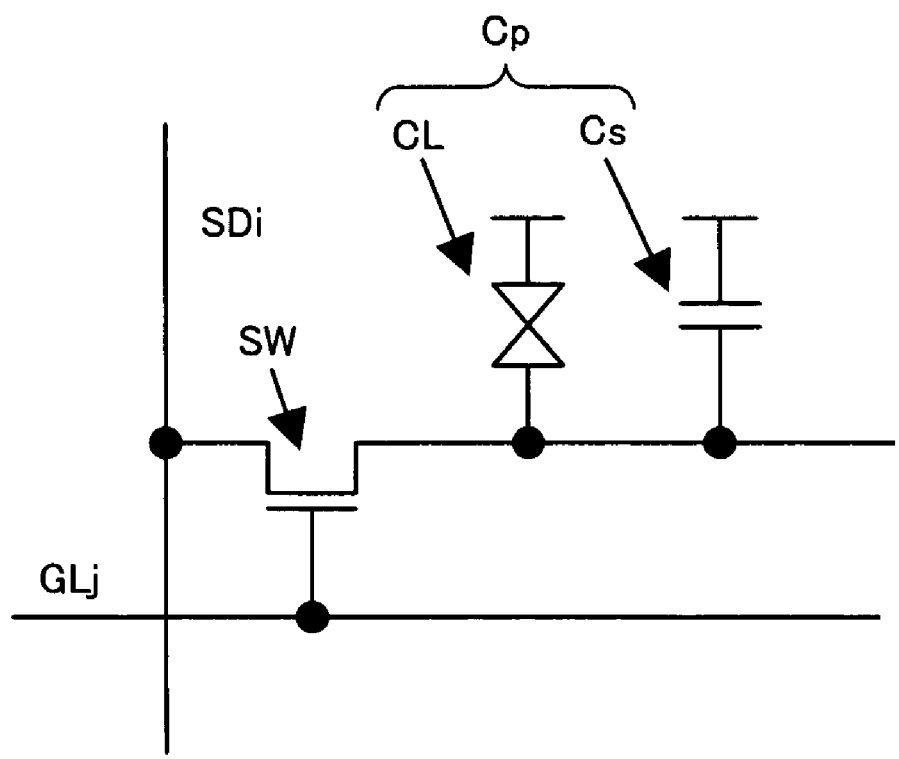
FIG. 11 is an equivalent circuit diagram of a pixel in the image display device in FIG. 10.

The display section 34 reproduces an image in the following manner: Into the pixels PIX provided in the respective areas framed by m scanning signal lines GL1 through GLm and k data signal lines SD1 through SDk being orthogonal to the scanning signal lines GL1 through GLm, the scanning signal line drive circuit 35 and the data signal line drive circuit 36 serially write video signals DAT which are supplied from the control circuit 33, via the scanning signal lines GL1 through GLm and the data signal lines SD1 through SDk. FIG. 11 shows an example of the pixel PIX. In the figure, the scanning signal line and the data signal line are denoted by GLj and SDi, respectively, in order to indicate the address. "i" is an arbitrary number not more than k, while "j" is an arbitrary number not more than m.

The pixel PIX is made up of: a field-effect transistor (switching element) SW whose gate is connected to the scanning signal line GL and whose source is connected to the data signal line SD; and a pixel capacity Cp whose one electrode is connected to the drain of the field-effect transistor SW. The other electrode of the pixel capacity Cp is connected to a common electrode line which is commonly connected to all pixels PIX. The pixel capacity Cp is made up of a liquid crystal capacity CL and an auxiliary capacity Cs which is added as the need arises.

When the scanning signal line GL is selected, the field-effect transistor SW is turned on, so that the voltage appearing on the data signal line SD is supplied to the pixel capacity Cp. Meanwhile, during a period in which the selection of the scanning signal line GL has finished and the field-effect transistor SW is turned off, the pixel capacity Cp keeps the voltage which is applied before the turning off. The transmittance or reflectance of the liquid crystal changes in accordance with the voltage applied to the liquid crystal capacity CL. Thus, image display on the pixel PIX can be changed in accordance with the video signal DAT, by selecting the scanning signal line GL and applying, to the data signal line SD, a voltage corresponding to the vide signal DAT.

From the control circuit 33 to the data signal line drive circuit 36, the video signal signals DAT supplied to the pixels PIX are transmitted in a time-division manner. The data signal line drive circuit 36 thus samples, from the video signals DAT, image data supplied to the respective pixels PIX, at timings in accordance with (i) a clock signal SCK which is a timing signal, has predetermined intervals, and has a duty ratio of 50% (or less), (ii) an inversion signal SCKB which is the inversion of the clock signal SCK, (iii) a start pulse SSP, and (iv) an inversion signal SSPB which is the inversion of the start pulse SSP. More specifically, in sync with the timings at which the clock signals SCK and SCKB from the control circuit 33 are set to active, the shift register 36a serially shifts the start pulses SSP and SSPB, so as to generate output signals S1 through Sn having timings which are different from each other for a half of the cycle of the clock signals SCK and SCKB. Then the sampling circuit 36b samples the video signals DAT at the timings indicated by the output signals S1 through Sn, and outputs the sampling results to the respective data signal lines SD1 through SDk.

Similarly, in the scanning signal line drive circuit 35, the shift register 35a serially shifts the start pulses GSP and GSPB, in sync with the clock signals GCK and GCKB from the control circuit 33, so as to output scanning signals, which have timings different from each other at certain intervals, to the respective scanning signal lines GL1 through GLm.

In the image display device 31 being thus arranged, the display section 34 and the drive circuits 35 and 36 which are formed on the display panel 32 are made up of, as described above, polycrystalline silicon thin-film transistors, and the drive voltage Vcc of these members are set to about 15V. Meanwhile, in the case of the control circuit 33 which is an integrated circuit chip being separately provided and is made up of single-silicon transistors, the drive voltage is typically set to be 5V or lower, i.e. lower than the drive voltage Vcc.

In this manner, the display section 34 and the drive circuits 35 and 36 are formed on the substrate different from the substrate on which the control circuit 33 is formed. The number of signals exchanged between the circuits on the different substrates is much fewer than the number of signals exchanged among the display section 34 and the drive circuits 35 and 36. The signals exchanged between the circuits on the different substrates are only the video signals DAT, start pulses SSP, SSPB, GSP, and GSPB, clock signals SCK, SCKB, GCK, and GCKB, and the like. Furthermore, being made up of single-crystal silicon transistors, the control circuit 33 can easily obtain sufficient driving ability. Thus, even if the circuits are formed on different substrates, the complication in the manufacturing process, the increase of the capacity of the lines and the power consumption are restrained to be negligible.

In this manner, the drive circuits 35 and 36 monolithically formed on the display panel 32 are made of polycrystalline silicon and the like, so that the level shifter section 13 which is required for the reason that the drive voltage of the above-mentioned circuits is higher than that of external circuits is activated for the minimum period. Thus, in the image display device 31, the power consumption is reduced and the frame of the display panel is narrowed down.

Furthermore, since the drive circuits 35 and 36 are formed on the substrate on which the display section 34 is also formed, the lines connecting the drive circuits 35 and 36 with the pixels PIX can be provided on the same substrate, so that it is unnecessary to provide the lines outside of the substrate. For this reason, even if the numbers of the scanning signal lines GL and the data signal lines SD increase, the number of the signal lines outside the substrate does not change, and no additional lines are required. With this, the manufacturing process is simplified, the unnecessary increase of capacity of the signal lines is prevented, and the decrease in the degree of integration is prevented.

The drive circuits 35 and 36 are, furthermore, provided with switching elements each made up of polycrystalline silicon thin-film transistors. A polycrystalline silicon thin-film transistor is significantly inferior to a single-crystal silicon thin-film transistor in terms of performances as a transistor, so that the threshold of the polycrystalline silicon thin-film transistor is high and hence the drive voltage is also high. For this reason, a current-driven level shifter is required, causing such a big problem that a stationary current accounts for a large percentage of the power consumption. Furthermore, the stationary current causes the degradation of the transistor.

This stationary current can be significantly reduced by adopting the drive circuits 35 and 36 including the shift register 11 of the present invention, so that the above-described problem of the polycrystalline silicon thin-film transistor is significantly relieved.

The polycrystalline silicon thin-film transistor also has such a problem that, since the size of crystal of silicon is not uniform, the characteristics of transistors formed on one glass substrate are different to each other. In such a case, the intervals between the sampling pulses deviate, so that a lot of inverters in the delay circuit are required in order to suitably adjust the intervals between the sampling pulses, and these inverters occupy a large area.

In the meanwhile, the control circuit CN of the shift register 11 of the present invention obtains appropriate intervals of the sampling pulses by utilizing the inferior characteristics of the polycrystalline thin-film transistor, i.e. utilizing the delay of the circuits. Thus, the drive circuits 35 and 36 made of polycrystalline silicon can maximize the effects of the present invention.

Furthermore, the drive circuits 35 and 36 and the pixels PIX include switching elements manufactured at a process temperature not more than 600° C. For this reason, transistors can be formed on an inexpensive glass substrate, so that one can manufacture a great number of panels with low costs. This is advantageous in terms of commercial value. However, transistors manufactured at a temperature not more than 600° C. are polycrystalline rather than single-crystal, so as to be inferior in characteristics. Moreover, being dissimilar to a silicon wafer, glass includes a lot of impurities, thereby deteriorating the performance of a transistor. For these reasons, the problem of power consumption cannot be resolved when such transistors is adopted to a typical drive circuit.

If, meanwhile, transistors formed on a glass substrate have characteristics enough to the operation of a shift register, forming transistors for the pixels and transistors for the drive circuits on one glass substrate is better than adhering the drive circuits onto the display panel made up of a glass substrate, because the contact failure between the drive circuits and the display panel can be prevented, and the size of the panel module can be reduced. Furthermore, since the transistors for the drive circuits and the transistors for the pixels are formed in an identical process, the manufacturing costs can be reduced. Note that, however, being dissimilar to a silicon wafer, the glass substrate of the above-mentioned case is very large (one side is about several tens of centimeters to several hundreds of centimeters), and this induces the deterioration and fluctuation in the transistor performance, in terms of the process. Further, in the large-sized glass substrate, the load accompanied with the drive of the transistor is very heavy. Thus, the degree of the signal delay is high, the size of the transistor has to be large, and the performance of the shift register has to be improved in order to keep the delay to be within an acceptable range. As a result, the performance of a current-driven level shifter has to be improved, and a very large stationary current is required.

Thus, for significantly reducing such a stationary current, the drive circuits 35 and 36 of the present invention exert maximum effects.

Embodiment 2

The following will describe another embodiment of the present invention with reference to FIGS. 12-17.

Figure 12:
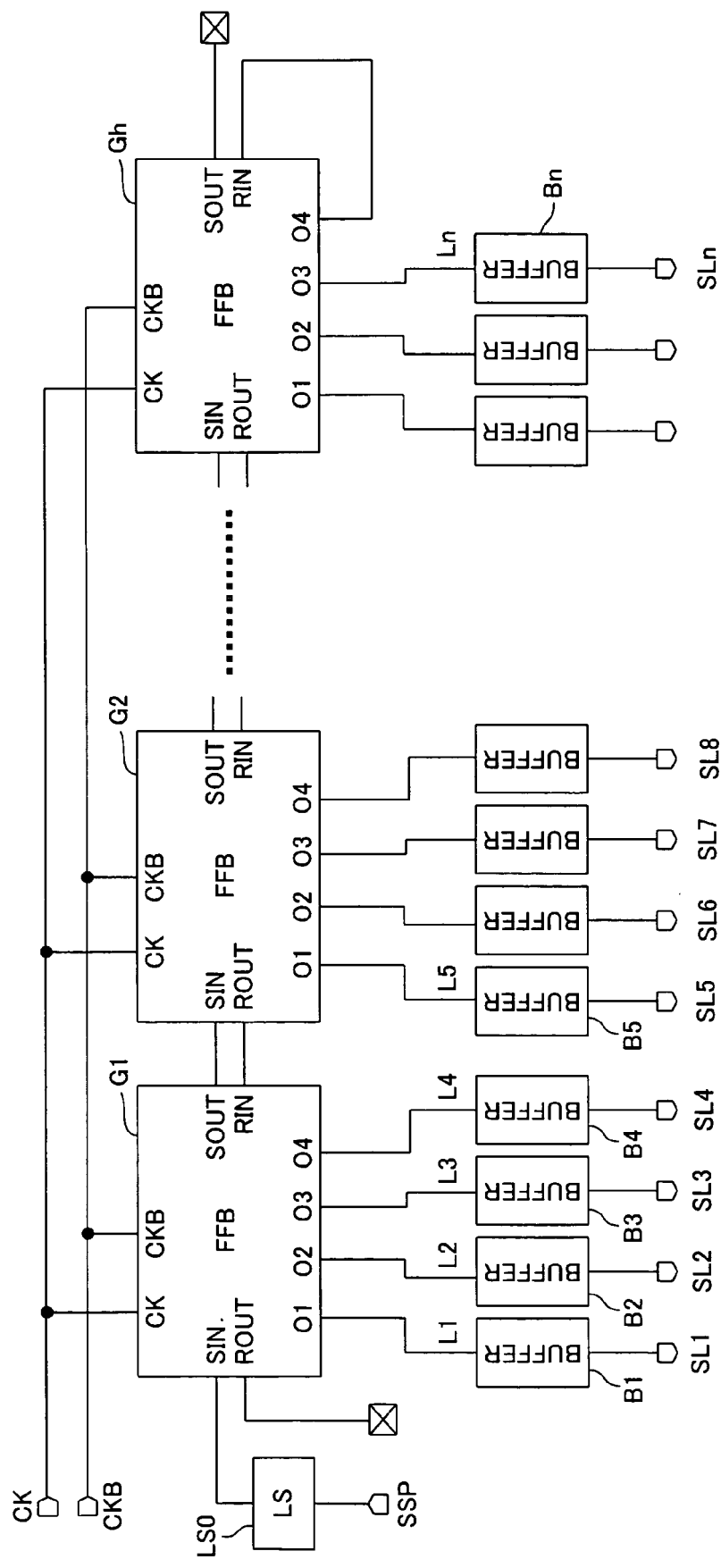
FIG. 12 is a block diagram showing circuitry of a shift register of another embodiment of the present invention.
Figure 13:
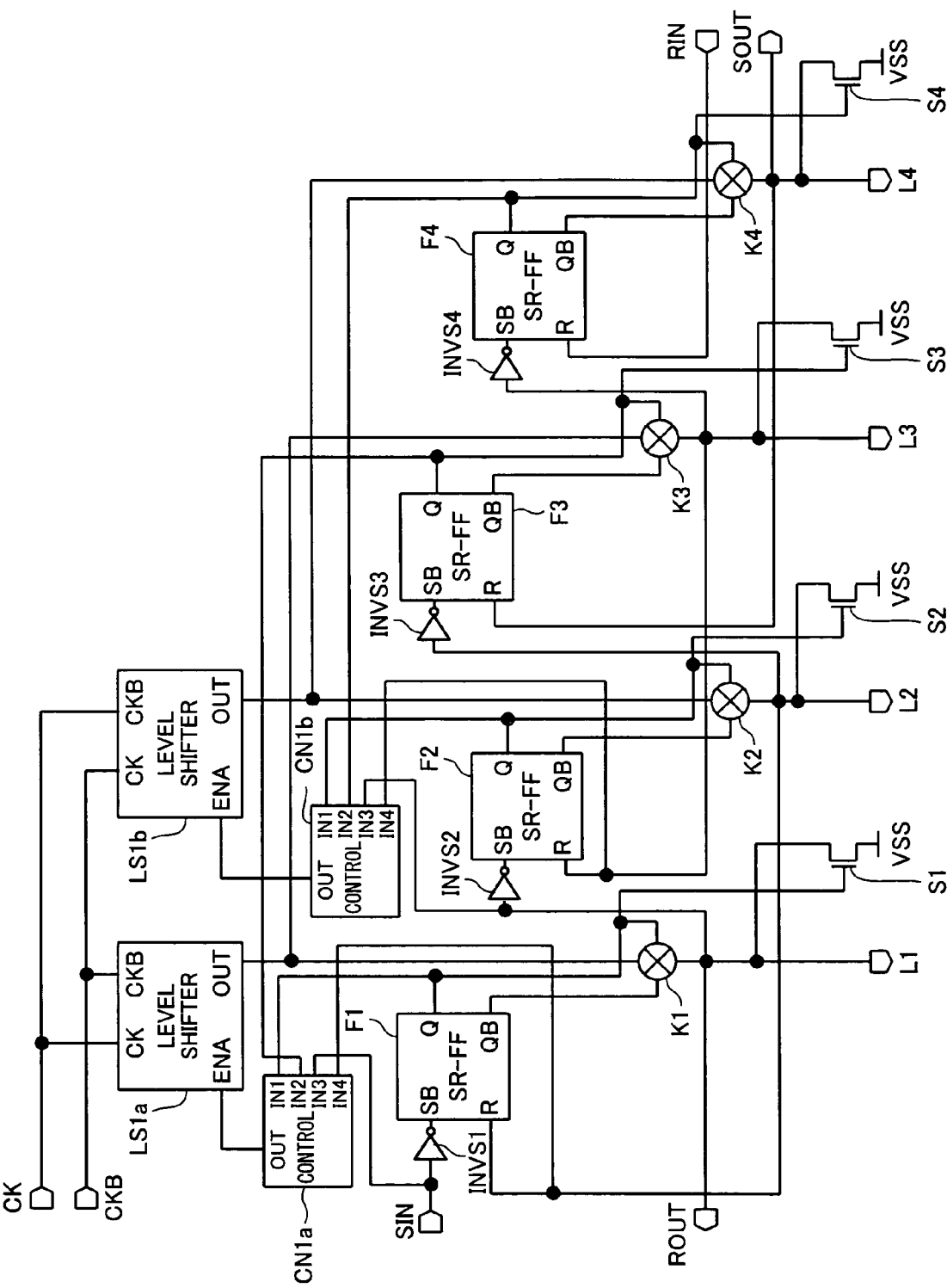
FIG. 13 is a block diagram of a flip-flop block of the shift register in FIG. 12.

FIG. 12 is a block diagram showing circuitry of a shift register 41 of another embodiment of the present invention. This shift register 41 is similar to the foregoing shift register 11. Thus, members having the same functions as those described above are given the same numbers, so that the descriptions are omitted for the sake of convenience. It should be noted that, in this shift register 41, the multi-stage flip-flops F1 through Fn are divided into a plurality of blocks, as flip-flop blocks G1, G2, . . . , Gh. In the example shown in FIG. 12, one flip-flop block G1 includes four flip-flops F1 through F4 as shown in FIG. 13, and hence n/4≈h. Taking this into consideration, it is possible to see that, in the shift register 11 in FIG. 1, each flip-flop block includes single-stage flip-flop.

In addition to the flip-flops F1 through F4, the flip-flop block G1 includes: two level shifters LS1a and LS1b; two control circuits CN1a and CN1b; inverters INVS1 through INVS4 corresponding to the flip-flops F1 through F4, respectively; analog switches K1 through K4 corresponding to the flip-flops F1 through F4; and switching elements S1 through S4 corresponding to the flip-flops F1 through F4.

Two level shifters LS1a and LS1b are provided for making it possible to output the output signals L1 through L4 both in the case that the clock signal CK is active and in the case that the clock signal CKB is active. The output OUT from the level shifter LS1a which operates under the influence of the output signal from the odd-number flip-flops F1 and D3 is switched at the analog switches K1 and K3 by the outputs QB from the odd-number flip-flops K1 and K3, and hence the output signals L1 and L3 are generated. When, meanwhile, the output OUT from the level shifter LS1*b* which operates under the influence of the even-number flip-flops F2 and F4 is switched by analog switches K2 and K4 by the outputs QB from the flip-flops F2 and F4, and hence the output signals L2 and L4 are generated. When the output signals L1 through L4 are not active, the outputs Q from the flip-flops F1 through F4 turn the switching elements S1 through S4 on, so that the output signals L1 through L4 are set to the level of LOW Vss drive voltage.

Figure 14:
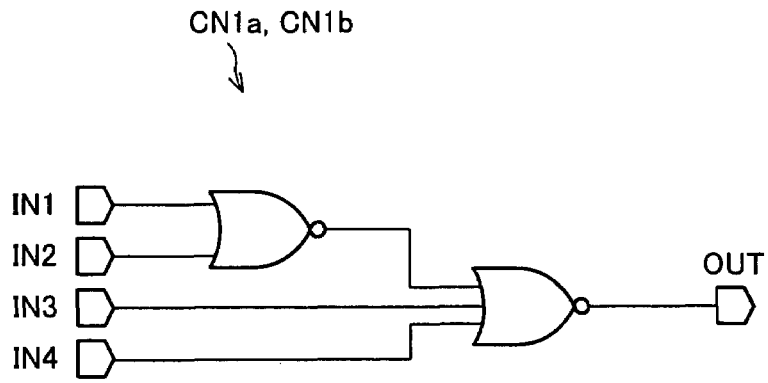
FIG. 14 shows how a control circuit of the shift register in FIG. 12 is structured.

Each of the control circuits CN1*a* and CN1*b* in the above-described flip-flop block G1 is, as shown in FIG. 14, made up of two NOR circuits. The remaining flip-flop blocks G2 through Gh are identical in terms of structure with the flip-flop block G1.

Figure 15:
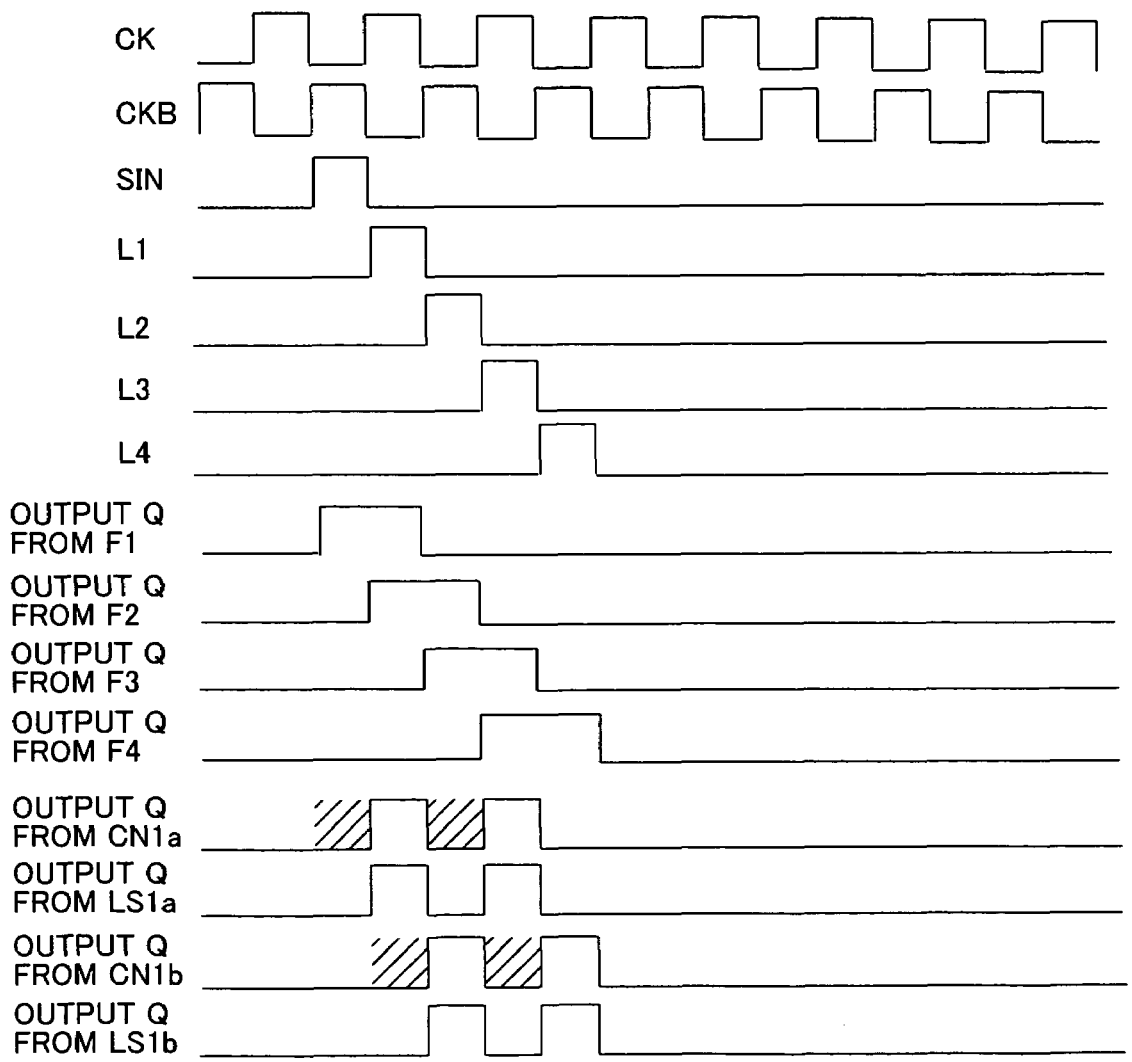
FIG. 15 shows an waveform chart for illustrating the operation of the shift register in FIG. 12.
Figure 16:
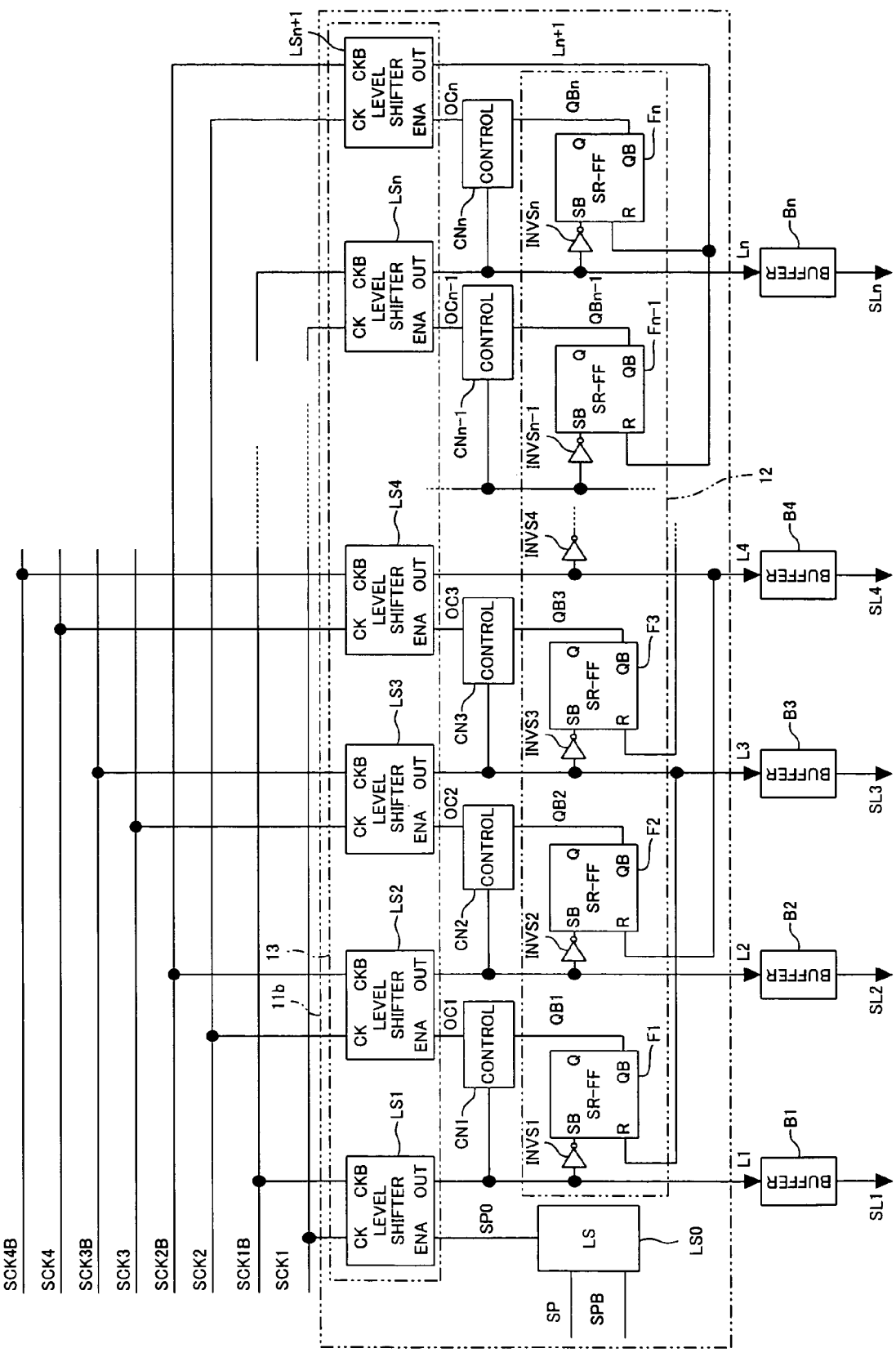
FIG. 16 is a block diagram for showing another example of the shift register in FIG. 1.

FIG. 15 is an waveform chart for illustrating the operation of the shift register 41 being thus arranged. To the control circuit CN1*a*, the output signals Q are supplied from the flip-flops F1 and F3, and the operation periods of the flip-flops F1 and F3 are detected in order to cause the output signals L1 and L3 to pulse. Furthermore, in accordance with (i) the detected periods, (ii) either the output signal (or start pulse) from the shifter register or the input signal SIN of the flip-flop block, and (iii) the output signal L2, the output signal is outputted from the control circuit CN1*a* only during periods required for the level shifting, while the operation of the level shifter LS1*a* is stopped during (shaded) periods in which the level shifting is unnecessary.

Similarly, to the control circuit CN1*b*, the output signals Q are supplied from the flip-flops F2 and F4, and periods during which the flip-flops F2 and F4 operate are detected in order to cause the output signals L2 and L4 to pulse. In accordance with the detected signals and based on the output signals (or start pulses) L1 and L3 from the shift register, the output signal is outputted from the control circuit CN1*b* only during periods in which the level shifting is unnecessary. As a result, the level shifters LS1*a* and LS1*b* are stopped during the periods indicated by shades as shown in FIG. 15, so that the power consumption is reduced.

Note that, however, the activation time of the level shifter LS is not identical with one SCK clock but identical with one pulse of a sampling pulse and the like corresponding to the level shifter LS.

In the present embodiment, the control circuit CN1*a*, the level shifter LS1*a*, and the flip-flop F2 make up one stage, the control circuit CN1*a*, the level shifter LS1*a*, and the flip-flop F4 make up one stage, the control circuit CN1*b*, the level shifter LS1*b*, and the flip-flop F3 make up one stage, and the control circuit CN1*b*, the level shifter LS1*b*, and the flip-flop F1 which belongs to the next flip-flop block make up one stage. As the waveforms of the output signals from the control circuits CN1*a* and CN1*b* in FIG. 15 indicate, in each stage, the control circuit CN1*a* controls the operation time of the level shifter LS1*a* to include the timing at which the output signal from the level shifter LS1*a* rises, and the control circuit CN1*b* controls the operation time of the level shifter LS1*b* to include the timing at which the output signal from the level shifter LS1*b* rises, and to be shorter than the cycle of the clock signals CK and CKB.

Note that, from which part the control output to the control circuit CN is preferably fetched differs between circuit arrangements. For instance, the output on the previous line may be used in the case of the shift register 11. Alternatively, when the flip-flop is reset using a signal of a stage of some stages later and the pulse width of the Q signal is widened, the shift register may be activated only during a period corresponding to one SCK clock, using the outputs from a plurality of stages. In other cases, a plurality of outputs are used as in FIG. 13, or the control is carried out using the output from the same stage. Roughly speaking, the activation time of the level shifter is caused to substantially correspond to one SCK clock, using the outputs including the output of the same stage. Further, whether or not the pulses inputted to the respective blocks are transmitted to the next blocks is determined based on the outputs from the flip-flops of the respective blocks and the states of the outputs from the respective blocks.

In the shift registers 11, 11*a* and 31, the output L obtained by stepping up/down the clock signals CK and CKB by the level shifter LS is set as the output SL of the shift register, as is the case with the above-mentioned Japanese Laid-Open Patent Application No. 2001-307495. However, the output Q from the flip-flop may be set as the output SL from the shift register, as is the case with the above-mentioned Japanese Laid-Open Patent Application No. 2000-339984 (Tokukai 2000-339984; published on Dec. 8, 2000, corresponding to US 2003/0174115A1). This arrangement can be easily realized only by adopting, instead of the output signal L from the level shifter LS, the output signal Q from the flip-flop F as the output to the outside of the shift register, and adjusting the wiring of the flip-flop F to the reset R.

When, as in the shift registers 11, 11*a*, and 41, the output L obtained by stepping up/down the clock signals CK and CKB by the level shifter LS is adopted as the output SL supplied to the outside of the shift register, the following arrangement is preferable: First, the clock signals CK and CKB stepped up/down by the level shifter LS are set as the output signal L of the shift register 11, 11*a*, or 31, and the output signal L has a pulse width identical with that of the clock signals CK and CKB, or the output signal L has a pulse width with which pulses are shortened so as not to overlap each other even if the pulses are blunted. Thus, it is possible to adjust the output signal Li being stepped up/down and the neighboring output signals Li−1 and Li+1 being stepped up/down not to overlap each other.

Furthermore, assuming that M is an integer not less than 2, M types of clock signal source pulses whose phases are different to each other for a 1/M cycle are serially supplied to the multi-stage flip-flops at intervals of (M−1) stages, instead of the clock signals CK and CKB. More specifically, to the shift register 11*b* in FIG. 16, the clock signal source pulses SCK1 through SCK4 shown in FIG. 17 and inversion signals which are inversions of the clock signal source pulses SCK1 through SCK4 are serially supplied. With this, the clock frequency is reduced to 1/M, and when the shift register being thus arranged is adopted to the drive circuits 35 and 36, the frequency is kept to be low when the clock signals are supplied from the control circuit 33. Furthermore, the load on the lines can be reduced as much as the number of switching lines to which the clock signal source pulses SCK1 through SCK4 are supplied is reduced. On this account it is possible to further reduce the power consumption of the control circuit 33.

Figure 17:
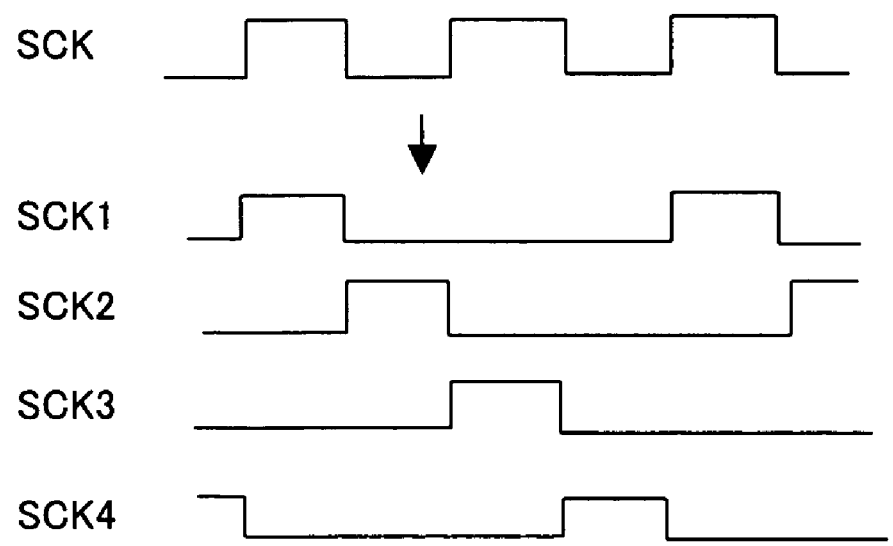
FIG. 17 shows an waveform chart illustrating a clock signal of multiple M (M=3) phase.

Furthermore, the M types of clock signals are caused to have phases whose active periods do not overlap each other. To realize this, the duty ratio between the M types of clock signals are set to be not more than 100×(1/M). This makes it possible to do away with the delay circuits after the circuit from which the output is supplied to the outside of the shift register, thereby simplifying the circuit and hence reducing the width of the frame of the display panel. Moreover, since the duty ratio can be adjusted, the pulse width can be easily and arbitrarily adjusted without altering the circuitry of the shift register. As the phases differ from each other for 1/M of the cycle of the clock signal source pulses, a cycle twice as much as the 1/M of the cycle of the clock signal source pulses can be defined as one cycle of a signal which is a combination of M types of clock signal source pulses. This cycle being thus defined is identical with the cycle of the clock signals CK and CKB. When, as shown in FIG. 17, the active period (in the figure, the length of the HIGH pulse) of the clock signal source pulses is identical with 1/M of the cycle of the clock signal source pulses, the combination of the M types of the clock signal source pulses is identical with the clock signals CK and CKB.

Embodiment 3

A further embodiment of the present invention will be discussed with reference to FIGS. 24-34.

Figure 24:
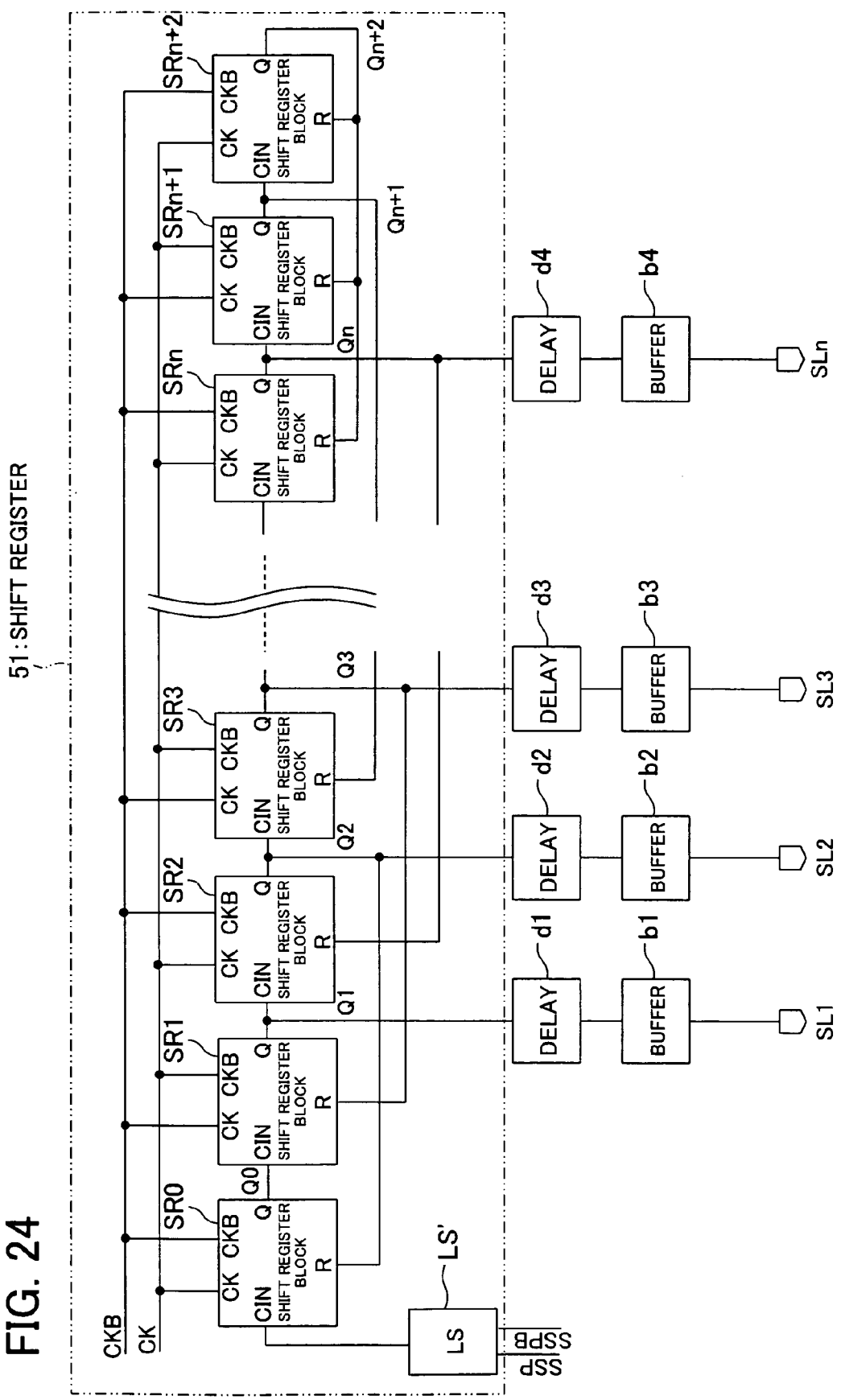
FIG. 24 is a block diagram showing circuitry of a shift register of a further embodiment of the present invention.

FIG. 24 is a block diagram showing circuitry of a shift register 51 of the present embodiment. The shift register 51 includes shift register blocks SR0 through SRn+2 and a level shifter LS'. The shift register blocks SR0, SR1, . . . , and SRn+2 are cascaded. Each of these shift register blocks includes clock input terminals CK and CKB, an input terminal CIN, an output terminal Q, and a reset terminal R. Provided that the shift register block SR0 is the 0th shift register block, an odd-number-th shift register block from the 0th shift register block receives a clock signal CK by the clock input terminal CKB and receives a clock signal CKB, which is an inversion of the clock signal CK, by the clock input terminal CK. In an even-number-th shift register block, the clock signal CK appears at the clock input terminal CK, and the clock signal CKB appears at the clock input terminal CKB.

The level shifter LS' generates a pulse signal in the following manner: start pulse signals SSP and SSPB supplied from the outside of the shift register 51 are caused to level-shift in such a manner as to allow the shift register block SR0 to operate. Then the level shifter LS' supplies the generated pulse signal to the input terminal CIN of the shift register block SR0. From this pulse signal, the shift register block SR0 generates an output signal Q0, and outputs the same from the output terminal Q. This output signal Q0 is supplied to the input terminal CIN of the shift register block SR1. Subsequently, the pulse signal is serially transferred in a similar manner, and finally reaches the shift register block SRn+2. In the course of the transfer, output signals Q1 through Qn+2 are serially outputted. The reset terminals R of the shift register blocks SR0 through SRn are connected to the output terminals Q of the shift register blocks which are two stages after the shift register blocks SR0 through SRn. The pulse signals of the output signals Q0 through Qn from the shift register blocks SR0 through SRn are caused to fall, i.e. to be reset by the input of the output signals from the shift register blocks which are two stages after the shift register blocks SR0 through SRn. The reset terminals of the shift register blocks SRn+1 and SRN+2 are connected to the output terminal Q of the shift register block SRn+2, so that the output signals from the shift register blocks SRN+1 and SRN+2 are reset by the output signal from the shift register block SRN+2.

The output signals Q1 through Qn from the shift register blocks SR1 through SRn are processed to be signals outputted to the outside of the shift register 51. These output signals are processed by delay circuits d1 trough dn and buffers b1 through bn which are identical with those illustrated in FIG. 18, so as to become output signals SL1 through SLn which are sampling pulses, scanning signals, and the like.

Figure 25:
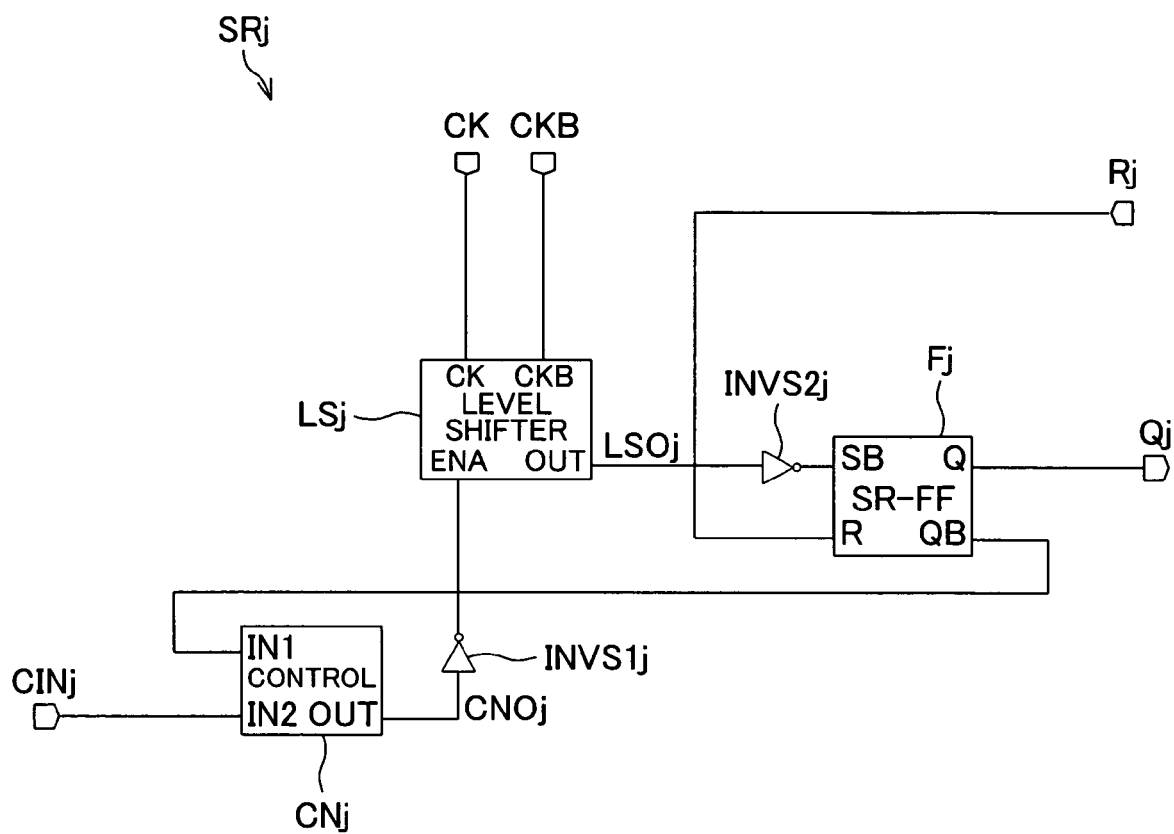
FIG. 25 is a block diagram showing an example of a shift register block in the shift register in FIG. 24.

FIG. 25 shows how each of the shift register blocks is structured. The illustrated shift register block SRi (i=0 through n+2) is identical with all of the shift register blocks SR0 through SRn+2.

The shift register block SRi includes a control circuit CNi, a level shifter LSi, a flip-flop Fi, and inverters INVS1*i* and INVS2*i*.

The level shifter LSi and the flip-flop Fi are identical with the level shifter LSi and the flip-flop Fi in FIG. 1, respectively.

The control circuit CNi includes two input terminals IN1 and IN2. The input terminal IN2 is connected to the input terminal CIN (CINi in the figure) of the shift register block SRi, while the input terminal IN1 is connected to an inverted output terminal QB of the flip-flop Fi. An output terminal OUT of the control circuit CNi is connected to an enable terminal ENA of the level shifter LSi via the inverter INVS1*i*, and receives an inverted signal of an output signal CNOi from the control circuit CNi. Clock input terminals CK and CKB of the level shifter function as the clock input terminals CK and CKB of the shift register block SRi. An output terminal OUT of the level shifter is connected to an inverted set input terminal SN of the flip-flop Fi via the inverter INVS2*i*, and receives an inverted signal of an output signal LSOi from the level shifter LSi. A re-inverted output terminal Q (Qi in the figure) of the flip-flop Fi functions as the reset terminal R (Ri in the figure) of the shift register block SRi.

Figure 26:
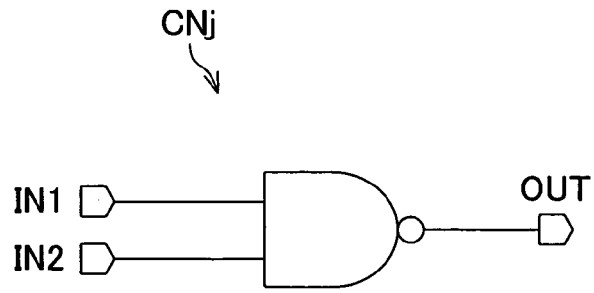
FIG. 26 is a circuit block diagram showing circuitry of a control circuit of the shift register block in FIG. 25.

FIG. 26 shows how the control circuit CNi is structured. The control circuit CNi is made up of a two-input NAND circuit in which the input terminals IN1 and IN2 are input terminals and the output terminal OUT is an output terminal.

In the present embodiment, the control circuit CNi, the level shifter LSi, and the flip-flop Fi in each of the shift register blocks SR0 through SRn are teamed up as one stage. Hereinafter, a character k is sometimes used instead of i (1 through n) in order to emphasize the members in one stage.

Figure 27:
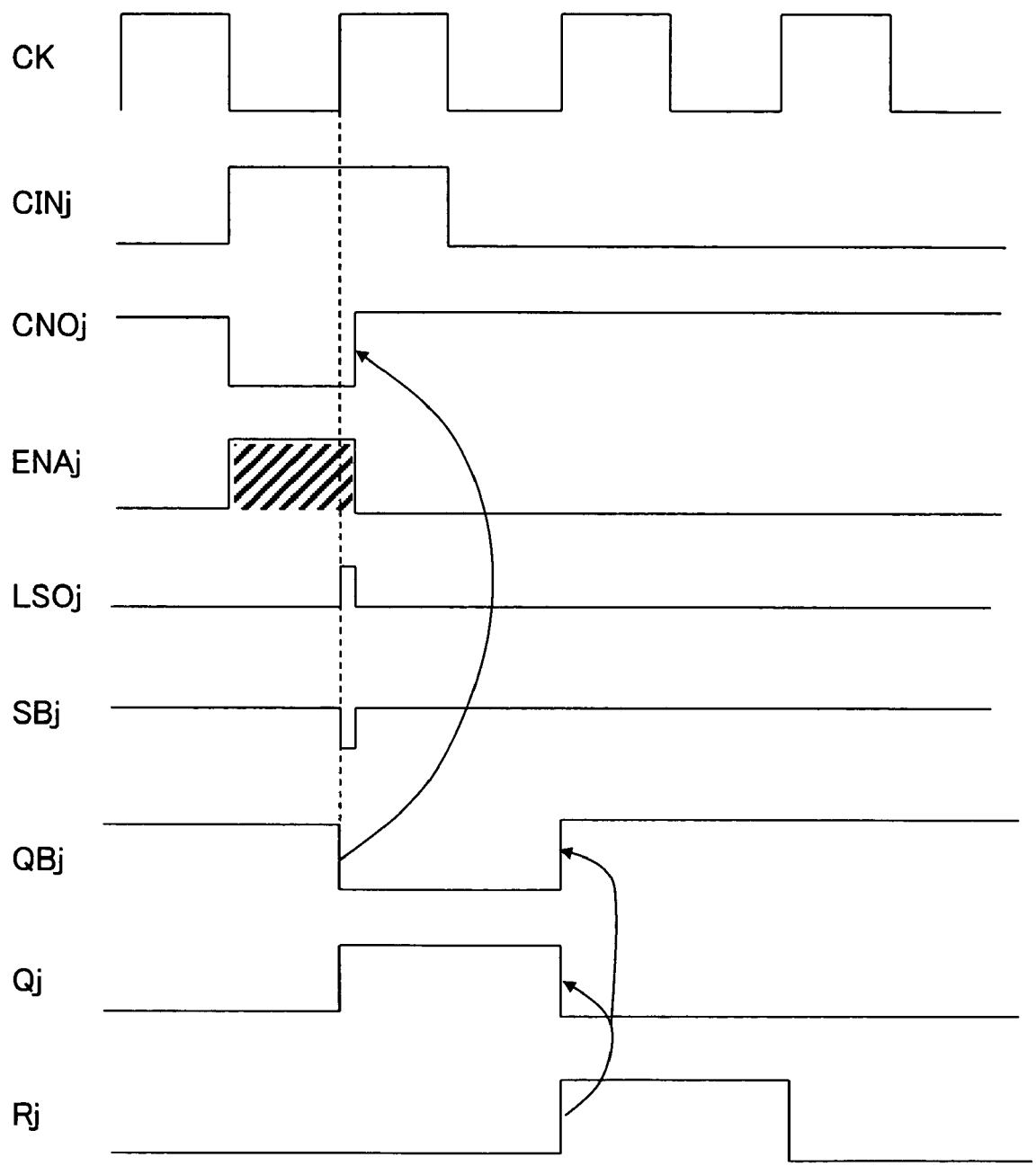
FIG. 27 is a timing chart for illustrating the operation of the shift register block in FIG. 25.
Figure 28:
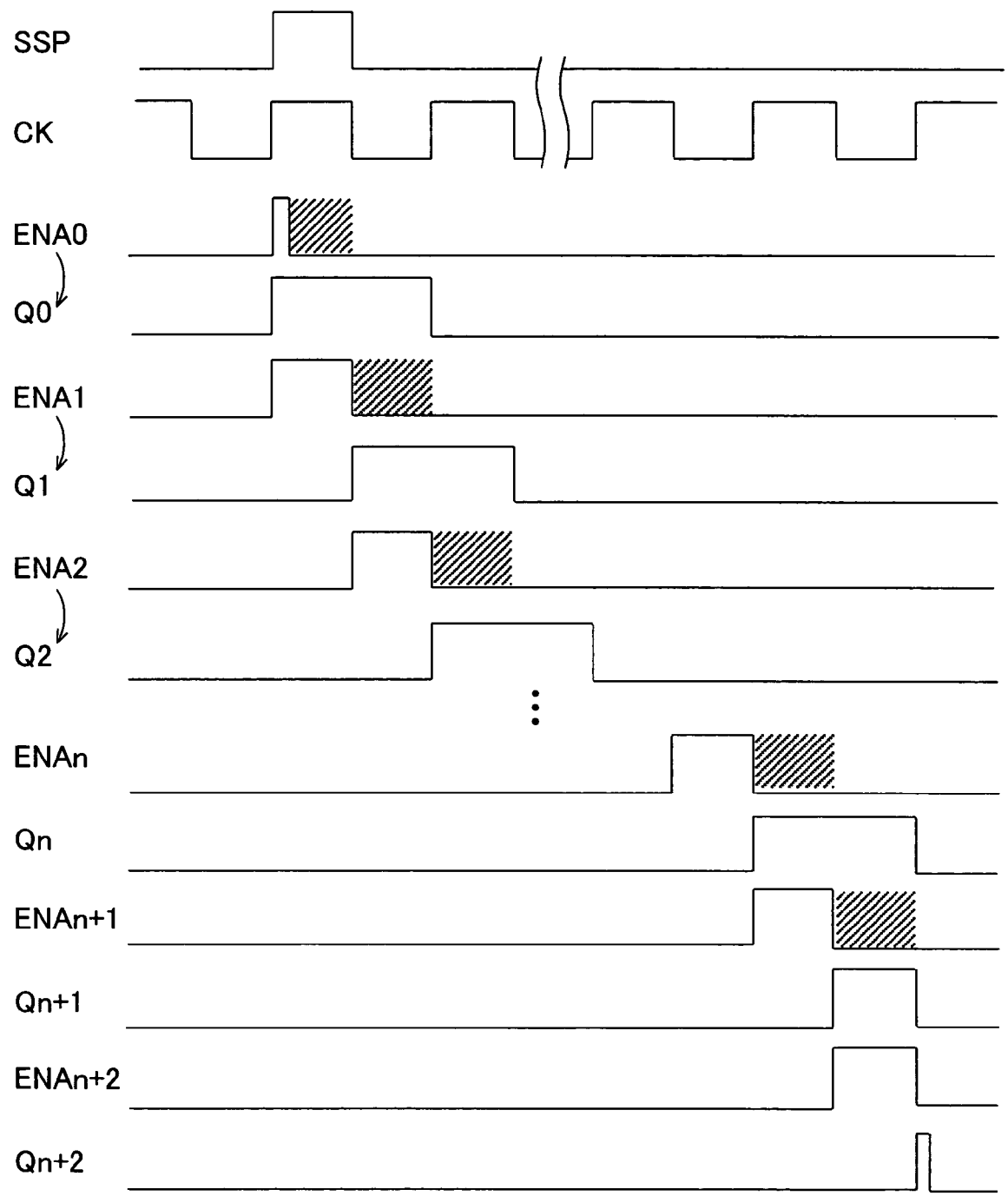
FIG. 28 is an waveform chart for illustrating the operation of the shift register in FIG. 24.

The operation of the shift register block SRi being thus arranged is discussed with reference to timing charts in FIGS. 27 and 28. FIG. 28 shows the waveforms of a start pulse signal SSP, clock signal CK, enable signal ENAi (hereinafter, the name of a signal may be described as the name of a terminal with an appropriate number) of the shift register block SRi, and output signal Qi. FIG. 27 shows the waveforms of respective signals in an odd-number-th shift register block SRi.

As shown in FIG. 28, the level shifter LS' receives the start pulse signal SSP whose pulse width is identical with that of the clock signal CK and an inversion signal SSPB (not illustrated) which is an inversion of the start pulse signal SSP. In the level shifter LS', the start pulse signal SSP is level-shifted up to the drive voltage of the flip-flop Fi, and outputted with no alteration in the phases, even if a small delay occurs. Then as shown in FIG. 25, the level-shifted start pulse signal SSP is, as an input signal CIN0, supplied to the shift register block SR0. Since an inverted output signal QB of the flip-flop F0 has been set to non-active HIGH in advance, an enable signal ENA0 of the level shifter LS0 rises to HIGH as shown in FIG. 28. Because of this, an output signal LSO0 of the level shifter LS0 rises to HIGH, so that the inverted output signal QB of the flip-flop F0 is set to active (i.e. set to LOW). After being set to active HIGH, this enable signal ENA0 falls to non-active LOW at a timing determined by a signal delay time elapsing in the circuits. This delay time at which the enable signal ENA0 is set to non-active is mainly made up of the delay time in the flip-flop F0 and the delay time in the control circuit CN0.

For this reason, the enable signal ENA0 is narrow in width as shown in FIG. 28. The output signal Q0 from the flip-flop F0 rises substantially in sync with the rise of the enable signal ENA0 as shown in FIG. 28. This output signal Q0 is kept to be active (i.e. HIGH) until being reset by an output signal Q2 from the shift register block SR2 which is two stages later.

Subsequently, the output signal Q0 turns to be the input signal CIN1 of the shift register block SRi, and the signal processing shown in FIG. 27 is carried out. It is assumed that i=1 in FIG. 27. Note that FIG. 27 illustrates the operation of an odd-number-th shift register block, and the clock signal CKB is supplied to the clock terminal CK. In the figure, the waveform "CK" indicates the waveform of the clock signal CKB. In the case of an even-number-th shift register block, this waveform "CK" indicates the waveform of the clock signal CK.

When the input signal CIN1 is HIGH, the inverted output signal QB from the flip-flop F1 is set to non-active HIGH in advance, so that the output signal CNO1 is set to LOW. This LOW signal is set to HIGH by the inverter INVS 11, and then supplied to the enable terminal ENA of the level shifter LS1. During a period in which the enable signal ENAL is HIGH, the level shifter LS1 is allowed to carry out the level shifting. When the level shifting is allowed, the clock signal CK is level-shifted and outputted as an output signal LSO1.

At the initial stage of the input of the HIGH signal to the enable terminal ENA, the clock signal CK is LOW, so that the output signal LSO1 from the level shifter LS1 is LOW. After one pulse of the clock signal CK (i.e. a half of the cycle of the clock signal CK), the clock signal CK is set to HIGH, so that the output signal LSO1 is set to LOW. The HIGH output signal LSO1 is set to LOW when passing through the inverter INVS2i, and then supplied to the inverted set input terminal SB of the flip-flop F1. As a result, the flip-flop F1 is set, so that the output signal Q1 of the flip-flop F1 is set to HIGH, while the inverted output signal QB1 is set to LOW. Since the inverted output signal QB1 is supplied to the input terminal IN1 of the control circuit CN1, the output signal CNO1 from the level shifter control circuit CN1 is set to HIGH when a time equivalent to the delay time in the control circuit CN1 has elapsed from the timing at which the inverted output signal QB1 is set to LOW. When the output signal CNO1 passes through the inverter INVS11 and the enable terminal ENA of the level shifter LS1 receives the LOW signal, the level shifter LS1 is caused to be in the non-operation state.

When the level shifter LS1 is caused to be in the non-operation state, the output signal LSO1 therefrom is set to LOW. In the meantime, the output signal Q1 and the inverted output signal QB1 from the flip-flop F1 are kept to be active (i.e. the output signal Q1 is HIGH and the inverted output signal QB1 is LOW) until the reset terminal R receives a HIGH signal. Subsequently, the output signal Q1 and the inverted output signal QB1 are set to non-active (i.e. the output signal Q is LOW and the inverted output signal QB is HIGH) when the output signal Q3, supplied from the flip-flop F3 of the shift register block SR3 which is two stages later, is set to HIGH.

Focusing on the enable signal ENA1 in FIG. 27, the operation time of the level shifter LS1, which is shaded, is substantially identical in length with the length of one pulse of the clock signal CK (i.e. a half of the cycle of the clock signal CK). The delay time at which the enable signal ENAL is set to non-active is mainly made up of the delay time in the flip-flop F1 and the delay time in the control circuit CN1.

Subsequently, as shown in FIG. 28, the output signals Qk are serially outputted from the shift register blocks SR1 through SRn+2 each having a stage identical with the above-mentioned stage, with the operation time of the level shifter LSk (k=1 through n) being gradually shortened. In the shift register blocks SRn+1 and SRn+2, the output signals Qn+1 and Qn+2 are reset by the output signal Qn+2 from the shift register block SRn+2.

As FIG. 28 illustrates, the operation time of the level shifter LSk (k=1 through n) is shorter by a shaded period than the operation time in a conventional art. The ultimate goal of the present embodiment is to obtain the output signal Qk (k=1 through n) from the shift register 51, so that the operation time of the level shifter LSk is caused to be minimum in order to obtain the output signal Qk. After the pulse of the output signal Qk from the shift register block SRk starts, it is possible to arbitrarily determine when the pulse stops. Once the pulse stops, the level shifter LSk is no longer required to operate, so that the enable signal ENAk is caused to be non-active immediately after the stop of the pulse, in order to terminate the shaded period. As FIG. 27 shows, after the pulse of the output signal LSOk from the level shifter LSk starts, the pulse of the output signal Qk from the flip-flop Fk starts. Therefore, once the pulse of the output signal LSOk starts, it is possible to set the enable signal ENAk to non-active.

The level shifter LSk, the flip-flop Fk, and the control circuit CNk cause delay for signal processing. The level shifter LSk cause the supplied clock signals CK and CKB to delay for a brief moment, and then outputs these signals as the output signal LSOk. After the level shifter LSk outputs the output signal LSOk, the pulses of the output signal Qk and the inverted output signal QBk start slightly after the start of the pulse of the output signal LSOk. Subsequently, slightly after the start of the pulses of the output signal Qk and the inverted output signal QBk, the output signal CNOk is outputted from the control circuit CNk, and the enable signal ENAk is set to LOW. The inverters INVS1k and INVS2k also cause delay, but such delay is not essential because the delay is for matching logics and buffering voltages, and some shift registers do not include the inverters INVS1k and INVS2k. Thus, the above-mentioned delay time is mainly made up of the delay time in the flip-flop Fk and the delay time in the control circuit CNk.

The above-mentioned basic idea is such that, once the pulse of the output signal Qk from the flip-flop Fk is secured, the operation of the level shifter LSk is no longer required. Based on this basic idea, the enable signal ENAk is set to non-active after a brief moment elapses from the start of the pulses of the output signal Qk and the inverted output signal QBk, so that the operation of the level shifter LSk is certainly stopped after the start of the pulse of the output signal Qk. In doing so, it is necessary to obtain the delay time in the control circuit CNk.

Moreover, as described above, the operation time of the level shifter LSk is arranged to be minimum because the operation of the level shifter LSk is no longer required once the pulse of the output signal LSOk starts. Based on this principle, the enable signal ENAk is set to non-active after a brief moment elapses from the start of the pulse of the output signal LSOk, so that the operation of the level shifter LSk is certainly stopped after or in sync with the start of the pulse of the output signal Qk. In doing so, it is necessary to obtain the delay time at least either in the flip-flop Fk or in the control circuit CNk. In the present embodiment, however, the delay times of both the flip-flop Fk and the control circuit CNk are utilized.

Note that, since the output signal Qk turns to an input signal CINk+1 supplied to the next shift register block SRK+1, the above-described delay retards the timing at which the enable signal ENAk+1 is set to active, so that the pulse width of the enable signal ENAk is substantially identical with the length of one pulse (substantially identical with a half of the cycle of the clock signal CK).

The essential feature of the present embodiment is to level-shift the edge of the rise of the clock signal. Therefore, even if the input signal CIN of the shift register block SRk is caused to delay in an active manner, the shift register can properly operate as long as the edge of the rise of the clock signal is level-shifted. Taking this into consideration, it is possible to further shorten the operation time of the level shifter LSk by causing the input signal CIN of the shift register block SRk to delay to the extent that the rising edge of the clock signal can be level-shifted. With this, the power consumption is further reduced by the shortened operation time. To delay the input signal CIN of the shift register block SRk, a plurality of inverters whose logics are matched with each other may be inserted. Alternatively, to delay the input signal CIN of the shift register block SRk, instead of designating the output of the shift register block SRk−1 as the input signal CIN of the shift register block SRk, the output of the shift register block SRk−1, which has been delayed in the delay circuit dk−1 and the buffer bk−1, may be designated as the input signal CIN supplied to the shift register block SRk.

In the shift register 51 of the present embodiment, the pulse length of the output signal Qk supplied to the outside of the shift register 51 is set to be twice as much as the pulse length of the clock signal, while the operation time of the level shifter LSk in the shift register block SRk is set to be substantially identical with the length of one pulse of the clock signal CK (i.e. substantially identical with a half of the cycle of the clock signal CK). The pulse length of the output signal Qk can be elongated irrespective of the operation time of the level shifter LSk, by appropriately selecting a signal functioning as the reset signal Rk.

As FIG. 27 shows, in each of the stages, the control circuit CNk (k=1 through n) controls the operation time of the level shifter LSk (i) to include the timing at which the output signal LSOk from the level shifter LSk rises and (ii) to be shorter than a cycle of the clock signals CK. This timing at which the output signal LSO1 rises is a timing to start the pulse, so as to indicate a timing at which both an output signal rising to HIGH and an output signal falling to LOW. The output signal Qk (or the inversion signal QBk) from the flip-flop Fk of each stage acts as a pulse signal supplied to the outside of the shift register 51. Thus, once the output signal Qk from the flip-flop Fk rises, a timing at which the output signal Qk falls can be arbitrarily set. Moreover, since it is unnecessary to keep the level shifter LSk operating, the operation time of the level shifter Lsk is set to be shorter than the cycle of the clock signals CK and CKB. That is to say, when the pulse length of the output signal Qk or the inversion signal QB is longer than the pulse length of the clock signals CK and CKB, the operation time of the level shifter LSk has conventionally been longer than the cycle of the clock signals Ck and CKB. In the present embodiment, meanwhile, the operation time of the level shifter LSk is shorter than the clock signals CK and CKB irrespective of the pulse length, so that the power consumption of the level shifter LSk can be reduced.

The level shifters LS0 and LSn+1 do not belong to any stage or block that outputs the output signal to the outside of the shift register 51. However, the operation times of these level shifters LS0 and LSn+1 are also shortened comparing to a case that no control circuits CN0 and CNn+1 are provided, as the waveforms of the enable signals ENA0 and ENAn+1 in FIG. 28 show. The operation time of the level shifter LSn+1 is shortened for a time equivalent to the pulse length of the clock signals CK and CKB (i.e. a half of the cycle of the clock signals CK and CKB).

Because of the above, a shift register consuming less amounts of power is realized.

Figure 29:
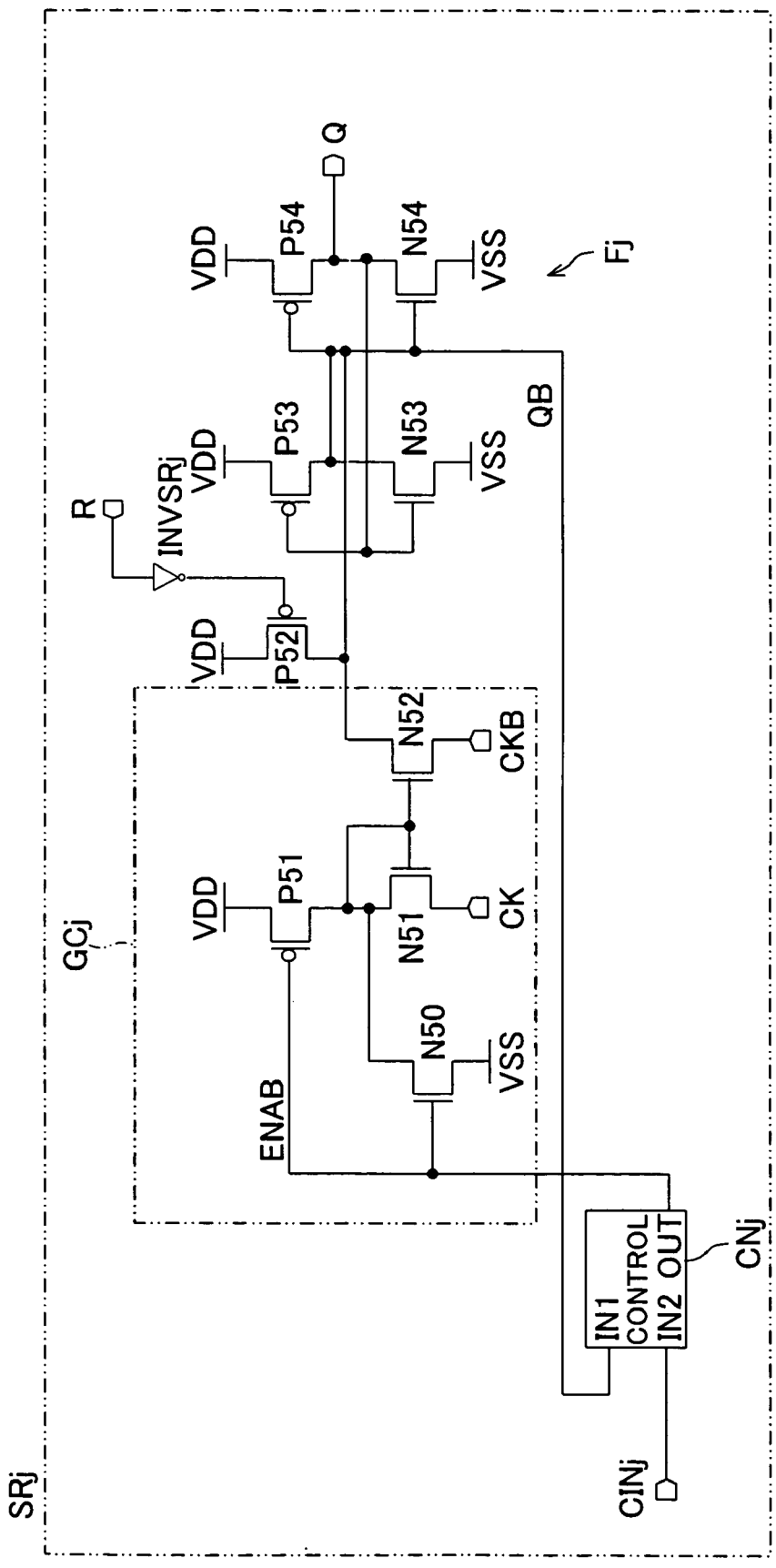
FIG. 29 is a block diagram showing an alternative example of the shift register block in FIG. 25.

Now, FIG. 29 shows such a case that a gating circuit and a flip-flop of Japanese Laid-Open Patent Application No. 2001-356728 (Tokukai 2001-356728; published on Dec. 26, 2001) are adopted as the level shifter and the flip-flop of the shift register block SRi. Note that the structure of the flip-flop is altered as a matter of convenience.

The gating circuit GCi includes transistors P51, N50, N51, and N52. The flip-flop Fi includes transistors P52, P53, P54, N53, and N54, and an inverter INVSRi. The transistors P51 through P54 are P-channel MOS transistors, while the transistors N50 through N54 are N-channel MOS transistors.

The transistors P51 and N51 are cascaded between a power source VDD and a clock input terminal CK. The transistor N50 is connected to the junction between the transistors P51 and N51 and to a power source VSS. The gates of the transistors P51 and N50 are connected to the output terminal OUT of the control circuit CNi. The gate of the transistor P51 is set to LOW active, and is connected to an enable terminal ENAB which correspond to the INVS1j and the enable terminal ENA of the level shifter LSi in FIG. 25. The transistors P52 and N52 are cascaded between the power source VDD and the clock input terminal CKB, and the junction of these two transistors is an output terminal of the gating circuit GCi. The gate of the transistor N52 is connected to the gate of the transistor N51, and these gates are connected to the drain of the transistor N51. The gate of the transistor P52 is LOW active and receives the output from the inverter INVSRi. An input terminal of the inverter INVSRi is a reset terminal of the flip-flop Fi. The transistors P53 and N53 are cascaded between the power sources VDD and VSS. The transistors P54 and N54 are cascaded between the power sources VDD and VSS. The gate of the transistor P53 is connected to the gate of the transistor N53, and the junction of these transistors is connected to the junction of the transistors P53 and N53 and is an inverted output terminal QB of the flip-flop Fi. The junction of the transistor P54 and N54 is a re-inverted output terminal Q of the flip-flop Fi.

Figure 30:
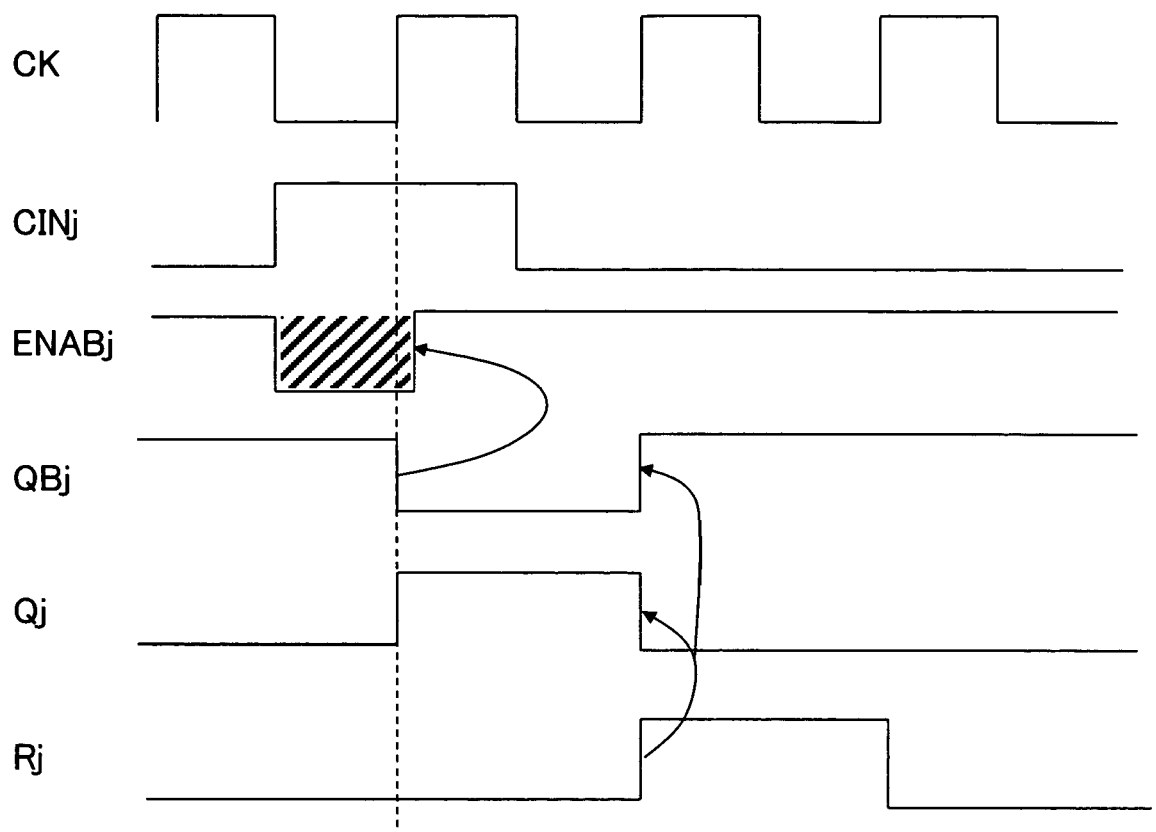
FIG. 30 is a timing chart for illustrating the operation of the shift register block in FIG. 29.
Figure 31:
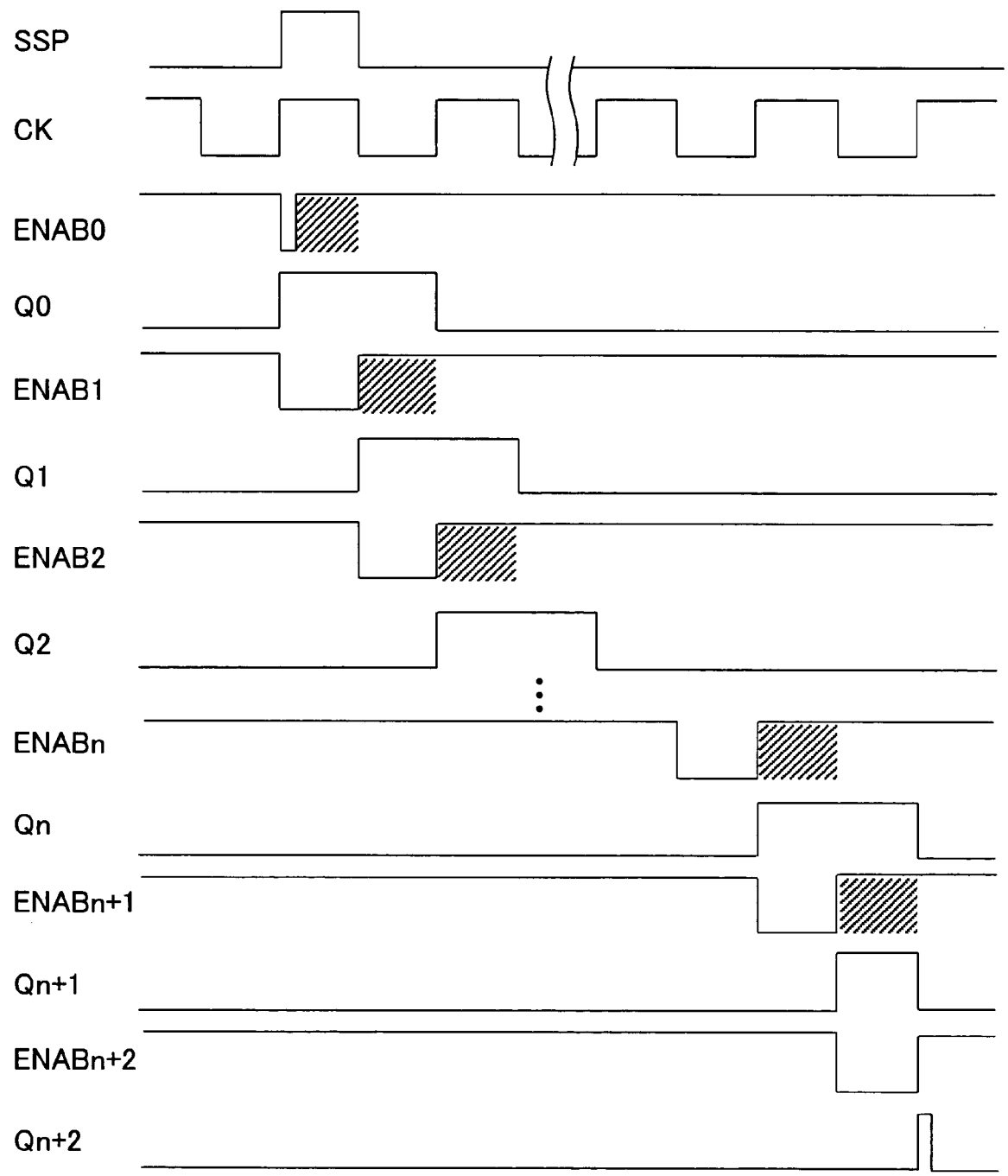
FIG. 31 is an waveform chart for illustrating the operation of the shift register which includes the shift register block shown in FIG. 29.

Now, the operation of the shift register block SRi being thus described is illustrated with reference to timing charts in FIGS. 30 and 31. FIG. 31 shows the waveforms of a start pulse signal SSP, clock signal CK, enable signal ENAi (hereinafter, the name of a signal may be described as the name of a terminal with an appropriate number) of the shift register block SRi, and output signal Qi. FIG. 30 shows the waveforms of respective signals in an odd-number-th shift register block SRi.

First, as shown in FIG. 31, the level shifter LS' receives the start pulse signal SSP whose pulse width is identical with that of the clock signal CK and an inversion signal SSPB (not illustrated) which is an inversion of the start pulse signal SSP. In the level shifter LS', the start pulse signal SSP is level-shifted up to the drive voltage of the flip-flop Fi, and outputted with no alteration in the phases, even if a small delay occurs. When, as shown in FIG. 29, the start pulse signal SSP having been level-shifted is, as the input signal CIN0, supplied to the shift register block SR0, the enable signal ENAB0 of the gating circuit GC0 is set to LOW as an inverted output signal QB of the flip-flop Of has been set to non-active LOW in advance. With this, the gating circuit GC0 is caused to operate so that the inverted output signal QB is set to active LOW. After being set to active LOW, the enable signal ENAB0 rises to non-active HIGH at a timing determined by a delay time elapsing in the circuits. This delay time at which the enable signal ENAB0 is set to non-active is predominantly elapses in the control circuit CN0.

For this reason, the enable signal ENAB0 has a narrow width as shown in FIG. 31. The output signal Q0 of the flip-flop F0 rises substantially in sync with the rise of the enable signal ENAB0 as shown in FIG. 31. This output signal Q0 is kept to be active (HIGH) until being reset by an output signal Q2 from the shift register block SR2 which is two stages later.

Subsequently, the output signal Q0 turns to be the input signal CIN1 of the shift register block SR1, and the signal processing shown in FIG. 30 is carried out. It is assumed that i=1 in FIG. 30. Note that FIG. 30 illustrates the operation of an odd-number-th shift register block, and the clock signal CKB is supplied to the clock terminal CK. In the figure, the waveform "CK" indicates the waveform of the clock signal CKB. In the case of an even-number-th shift register block, this waveform "CK" indicates the waveform of the clock signal CK.

When the input signal CIN1 is HIGH, the inverted output signal QB from the flip-flop F1 is set to non-active in advance, so that the output signal from the control circuit CN1 is set to LOW. This LOW signal is supplied to the enable terminal ENAB of the gating circuit GC1. The gating circuit GC1 is allowed to operate during a period in which the enable signal ENAB1 is LOW. When the gating circuit GC1 is allowed to operate, the clock signal CK is level-shifted and supplied to the flip-flop F1.

Since the clock signal CK is LOW and the clock signal CKB is HIGH at the initial stage of the input of the LOW signal to the enable terminal ENAB, the inverted output signal QB from the flip-flop F1 is kept to HIGH. The clock signal CK is set to HIGH and the clock signal CKB is set to LOW after a period equivalent to one pulse of the clock signal CK (i.e. a half of the cycle of the clock signal CK) has elapsed. Thus, the output signal Q1 from the flip-flop F1 is set to HIGH and. the inverted output signal QB1 is set to LOW. As the inverted output signal QB1 is supplied to the input terminal IN1 of the control circuit CN1, the output signal from the control circuit CN1 is set to HIGH when a time equivalent to the delay time in the control circuit CN1 has elapsed from the timing at which the inverted output signal QB1 is set to LOW.

When the enable terminal ENAB of the gating circuit GC1 receives a HIGH signal, the gating circuit GC1 is caused to be in the non-operation state.

When the gating circuit GC1 is caused to be in the non-operation state, the output signal therefrom is set to LOW. In the meantime, the output signal Q1 and the inverted output signal QB1 from the flip-flop F1 are kept to be active (i.e. the output signal Q1 is HIGH and the inverted output signal QB1 is LOW) until the reset terminal R receives a HIGH signal. Subsequently, the output signal Q1 and the inverted output signal QB1 are set to non-active (i.e. the output signal Q is LOW and the inverted output signal QB is HIGH) when the output signal Q3, supplied from the flip-flop F3 of the shift register block SR3 which is two stages later, is set to HIGH. The output signal Q3 is equivalent to the reset signal R1 in FIG. 30.

When the amplitude of the clock signals CK and CKB supplied to the gating circuit GC1 is narrower than the amplitude of the power supply voltage, a stationary current flowing in the gating circuit GC1 is generated. Paying attention to the enable signal ENAB1 in FIG. 30, the operation time of the gating circuit GC1 is substantially equivalent to the length of one pulse of the clock signal CK (i.e. equivalent to a half of the cycle of the clock signal CK). The delay time at which the enable signal ENAB1 is set to non-active is predominantly elapses in the control circuit CN1.

In a conventional art, a stationary current is generated during a period in which the input signal CIN1 is set to HIGH. On the other hand, in the above-described example, a stationary current flowing in the gating circuit GC1 is reduced.

Subsequently, as shown in FIG. 31, the output signals Qk are serially outputted from the shift register blocks SR1 through SRn each having a stage identical with the above-mentioned stage, with the operation time of the gating circuit GCk (k=1 through n) being gradually shortened. In the shift register blocks SRn+1 and SRn+2, the output signals Qn+1 and Qn+2 are reset by the output signal Qn+2 from the shift register block SRn+2.

As shown in FIG. 31, comparing to a conventional art, the operating time of the gating circuit GCk (k=1 through n) is shortened for the shaded period. The ultimate goal of the present embodiment is to obtain the output signal Qk (k=1 through n) from the shift register 51, so that the operation time of the gating circuit GCk is caused to be minimum in order to obtain the output signal Qk. After the pulse of the output signal Qk from the shift register block SRk starts, it is possible to arbitrarily determine when the pulse stops. Once the pulse stops, the gating circuit GCk is no longer required to operate, so that the enable signal ENABk is caused to be non-active immediately after the stop of the pulse, in order to terminate the shaded period. As FIG. 30 shows, once the pulses of the output signal Qk and the inverted output signal QBk from the flip-flop Fk start, (to be more precise, taking the below-mentioned delay into consideration, once the pulse of the inverted output signal QBk starts,) the enable signal ENABk can be set to non-active.

The gating circuit GCk, the flip-flop Fk, and the control circuit CNk cause delay for signal processing. The gating circuit GCk cause the level-shifted clock signals CK and CKB to delay for a brief moment, and then outputs these signals. After the signal output from the gating circuit GCk, the output signal Qk is outputted with a slight delay, while the inverted output signal QBk is outputted with no delay. Subsequently, slightly after the output of the inverted output signal QBk, the enable signal ENABk, which is the output signal from the control circuit CNk, is set to HIGH. Thus, the delay time after outputting the signal from the gating circuit GCk and before setting the enable signal ENABk to HIGH is mainly made up of the delay time in the control circuit CNk.

The above-mentioned basic idea is such that, once the pulse of the output signal Qk from the flip-flop Fk is secured, the operation of the gating circuit QBk is no longer required. Based on this basic idea, the enable signal ENABk is set to non-active after a brief moment elapses from the start of the pulse of the inverted output signal QBk, so that the operation of the gating circuit GCk is certainly stopped after the start of the pulse of the output signal Qk. In doing so, it is necessary to obtain the delay time in the control circuit CNk.

Since the flip-flop Fk outputs the inverted output signal QBk immediately after the gating circuit GCk outputs the signal (i.e. with no delay), the above-mentioned requirement to obtain the delay time in the control circuit CNk agrees with the idea of minimizing the operation time of the gating circuit GCk.

Note that, since the output signal Qk turns to an input signal CINk+1 of the next shift register block SRk+1, the above-mentioned delay retards a timing at which the next enable signal ENABk+1 is set to active, and the pulse width of the enable signal ENABk is substantially identical with the length of one pulse (i.e. substantially identical with a half of one cycle of the clock signal CK).

The essential feature of the present embodiment is to level-shift the edge of the rise of a desired clock signal during the operation time of the gating circuit GCk. Therefore, even if the input signal CIN of the shift register block SRk is caused to delay in an active manner, the shift register can properly operate as long as the edge of the rise of the desired clock signal is supplied to the gating circuit GCk, during the operation time of the gating circuit GCk. Taking this into consideration, it is possible to further shorten the operation time of the gating circuit GCk by causing the input signal CIN of the shift register block SRk to delay to the extent that the gating circuit GCk operates when the rising edge of the clock signal can be level-shifted. With this, the power consumption is further reduced by the shortened operation time. To delay the input signal CIN of the shift register block SRk, a plurality of inverters whose logics are matched with each other may be inserted. Alternatively, to delay the input signal CIN of the shift register block SRk, instead of designating the output of the shift register block SRk−1 as the input signal CIN, the output of the shift register block SRk−1, which has been delayed in the delay circuit dk−1 and the buffer bk−1, may be designated as the input signal CIN supplied to the shift register block SRk.

As a result, the effects similar to the case described with reference to FIGS. 27 and 28 are obtained.

Next, the following will discuss another arrangement in which an output signal from a flip-flop acts as a signal supplied to the outside of a shift register.

Figure 32:
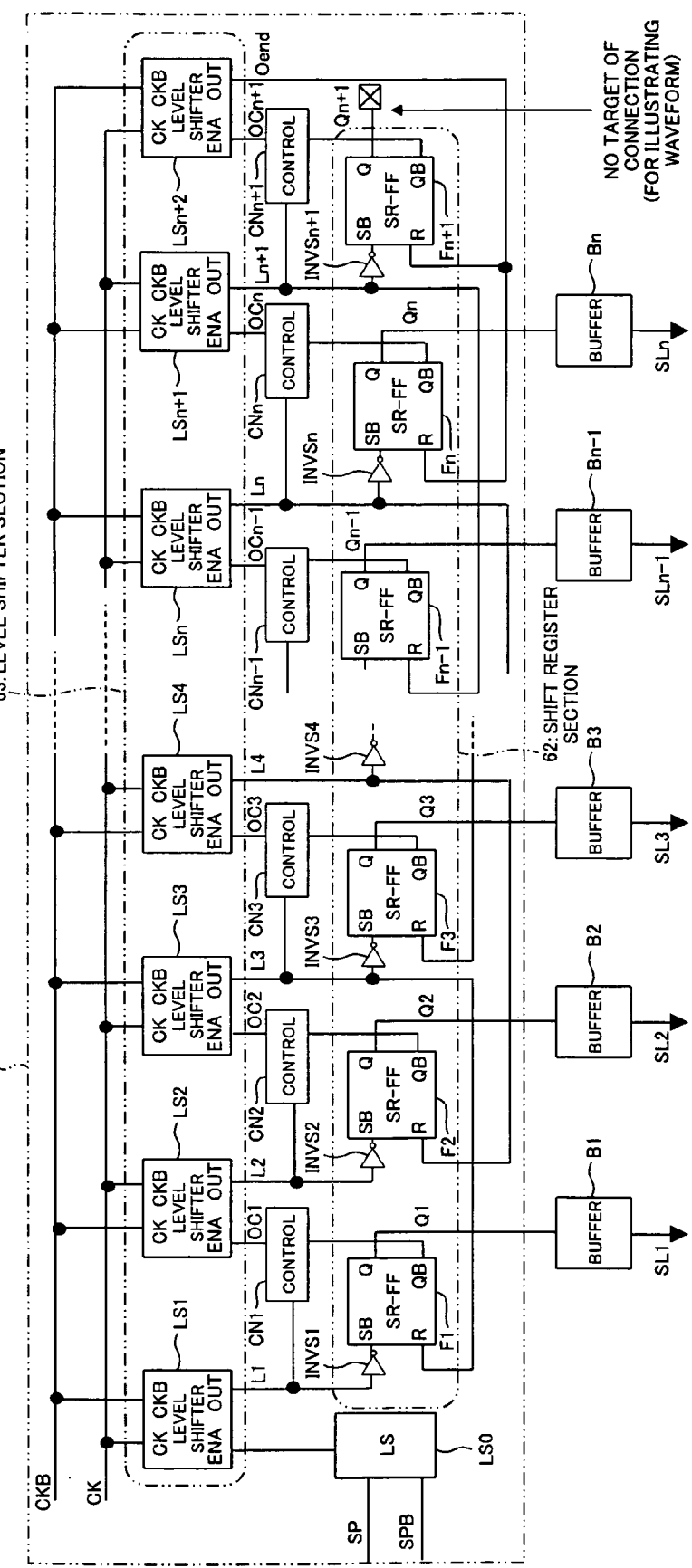
FIG. 32 is a block diagram showing circuitry of a shift register of a further embodiment of the present invention.

The shift register 61 in FIG. 32 is similar to the shift register 11 in FIG. 1. Thus, members corresponding to those described in Embodiment 1 are given the same numbers, so that the descriptions are omitted for the sake of convenience.

The shift register 61 includes a shift register section 62 and a level shifter section 63. The shift register section 62 is arranged in such a manner that a flip-flop Fn+1 is added to the shift register section 12 of the shift register 11 shown in FIG. 1, and the output signal Qi from the flip-flops Fi (i=1 through n) acts as a signal supplied to the outside of the shift register 61. It is noted that the output signal QN+1 from the flip-flop Fn+1 is not supplied to anywhere. Accordingly, the output signal Qi is supplied to a buffer Bi, so as to turn to an output signal SLi. The level shifter section 63 is arranged in such a manner that the level shifter LSn+2 is added to the level shifter section 13 of the shift register 11 in FIG. 1. Accordingly, the reset terminal of the flip-flop Fn+1 receives the output signal from the level shifter LSi+2 which is two stages later, and being similar to the reset terminal R of the flip-flop Fn, the reset terminal R of the flip-flop Fn+1 receives the output signal Oend from the level shifter LSn+2.

Figure 33:
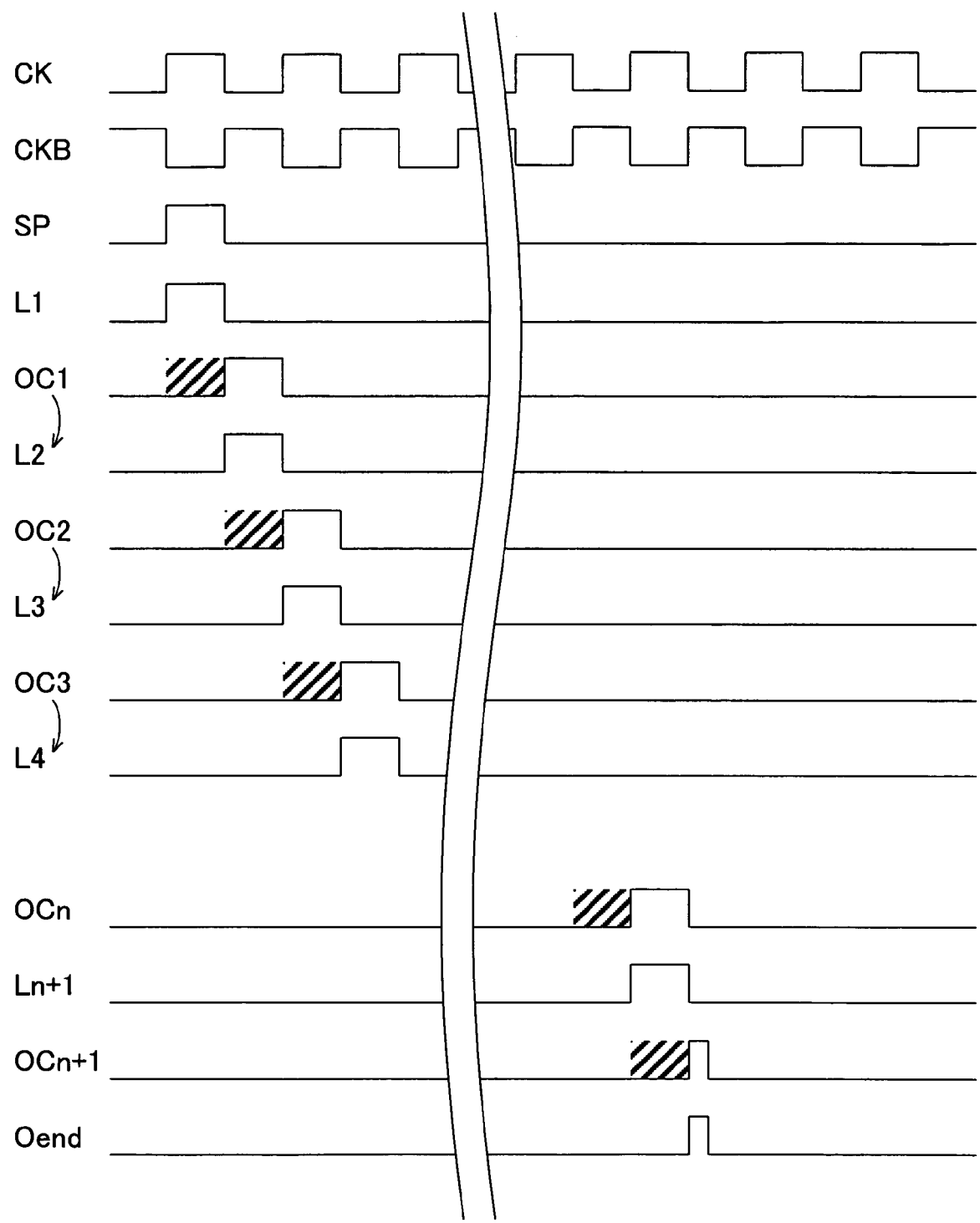
FIG. 33 is a first waveform chart for illustrating the operation of the shift register in FIG. 32.
Figure 34:
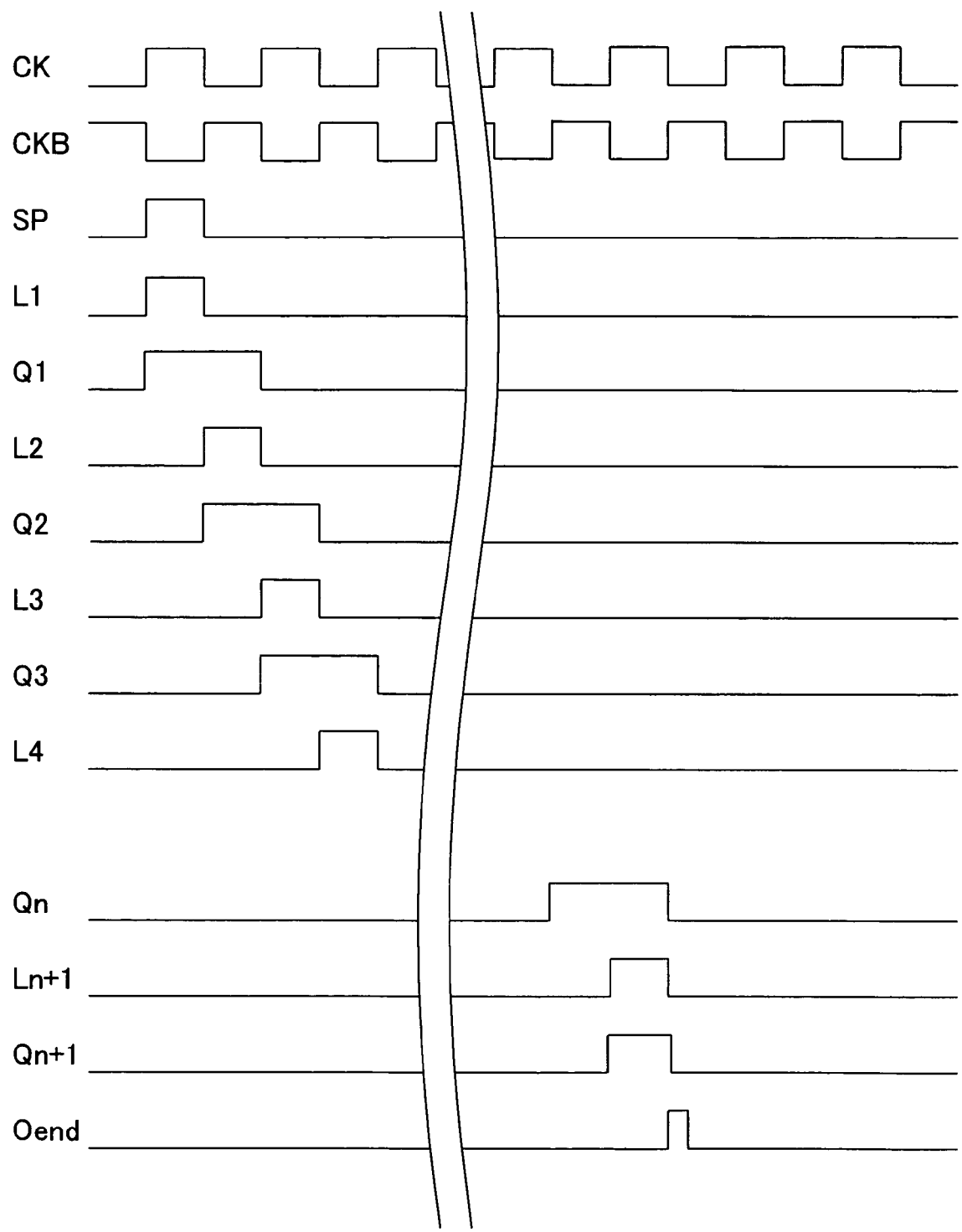
FIG. 34 is a second waveform chart for illustrating the operation of the shift register in FIG. 32.

FIG. 33 shows a timing chart of the waveforms of the output signal Lsi from the level shifter LSi of the shift register 61 and the output signal OCi from the control circuit CNi of the shift register 61. FIG. 34 shows a timings chart of the waveforms of the output signal LSi of the level shifter LSi of the shift register 61 and the output signal Qi of the flip-flop Qi of the shift register 61.

As FIG. 33 shows, the control circuit CNi (i=1 through n) controls the operation time of the level shifter LSi in such a manner as (i) to include the timing at which the output signal LSOi from the level shifter LSi rises and (ii) to be shorter than the cycle of the clock signals CK and CKB. Thus, even if, as shown in FIG. 34, the pulse length of the output signal Qi is twice as much as the pulse length of the clock signals CK (i.e. the output signal Qi is equivalent to one cycle of the clock signals CK and CKB), the operation time of the level shifter LSi, i.e. the operation time of the level shifter LSk (k=2 through n) of each stage is substantially equivalent to one pulse length of the clock signal CK (i.e. equivalent to a half of the cycle of the clock signal CK), as indicated by oblique lines in FIG. 33. For this reason, a stationary current flowing in the level shifter LSk is reduced.

Note that, the level shifters LSn+1 and LSn+2 do not belong to any stage or block from which an output signal is outputted to the outside of the shift register 61. However, as the waveforms of the output signals OCn and OCn+1 show, the operation times of these level shifters LSn+1 and LSn+2 are also shortened for a time equivalent to the pulse length of the clock signals CK and CKB (i.e. a half of the cycle of the clock signals CK and CKB), comparing to a case that the control circuits CNn and CNn+1 are not provided.

When, as in the present embodiment, a signal which is two times longer than the pulse length of the clock signals CK and CKB generated by utilizing the output signal Q (or its inverted output signal QB) from the flip-flop is adopted as a sampling pulse, the time for charging the source bus line is secured and the influence of the parasitic capacity of the next pixel is reduced. Thus, when using such a signal, the reduction of the operation time of the shift register is very important.

As described above, the shift register of the present invention is arranged in such a manner that, the level shifter includes a current-driven step-up transformer and/or a current-driven step-down transformer, which cause(s) an input switching element to which the clock signal is supplied to always turn on, when the level shifter is in operation.

According to this arrangement, each level shifter includes at least one of the current-driven step-up transformer or the current-driven step-down transformer. Being different from a voltage-driven level shifter which turns on/off an input switching element in line with the level of the input signal, the current-driven level shifter can successfully level-shift the input signal even if the amplitude of the input signal is lower than the threshold voltage of the input switching element. This current-driven level shifter, however, has such a setback that, when in operation, the input switching element to which the clock signal is supplied is always turned on, thereby consuming great amounts of electric power.

In this case, the present invention which minimize the operation period of the level shifter is very effective. With the present invention, a shift register which can carry out the level shifting even if the amplitude of the input signal is lower than the threshold voltage of the input switching element, while consumes low amounts of electric power.

The shift register of the present invention is arranged in such a manner that, the level shifter includes output stabilizing means which keeps a predetermined output voltage during a period in which the level shifter is stopped.

According to this arrangement, since the operation of the flip-flop connected to the level shifter may become unstable if the output voltage generally becomes unstable during a period in which the level shifter is stopped, the output stabilizing means is provided for keeping the output voltage of the level shifter to be at a predetermined value.

With this, the malfunction of the flip-flop due to the aforesaid unstable output voltage is prevented, so that a shift register which can stable operate is realized.

The shift register of the present invention is arranged in such a manner that, in each of the stages, the operation control means causes the level-shifted signal from the level shifter to rise after start of the operation period of the level shifter.

According to this arrangement, generally, in a case of an image display device and the like, a signal supplied to the outside of the shift register is used as a sampling signal and a scanning signal. If such a sampling signal overlaps a sampling signal of the previous stage or the next stage, a video signal is significantly varied, and an erroneous video signal is written into a data signal line. Also, when a scanning signal overlaps a scanning signal of the previous stage or the next stage, processes such refreshing a video signal in the data line cannot be carried out.

To solve these problems, the time at which the output signal from the level shifter starts to be active is delayed using the operation control means which controls the operation time of the level shifter.

Thus, to cause the active periods of the signals, which belong to two neighboring stages and supplied to the outside of the shift register, not to overlap each other, it is unnecessary to provide a delay circuit and the like in a stage after a circuit from which a signal is supplied to the outside of the shift register. When such a shift register is adopted as a drive circuit of a display device, it is possible to narrow the frame of the display device by simplifying the drive circuit, while keeping the sampling pulses not to overlap each other.

When an output from one of the circuits after the circuit for supplying the output to the outside of the shift register, the delay time can be arbitrarily determined by the output to be used, so that the aforesaid time at which the output signal from the level shifter starts to be active can be freely determined. For instance, in the case of the sampling signal and scanning signal, the time at which the output signal from the level shifter of one stage starts to be active is determined in accordance with the timing at which the last output from the previous stage turns to be non-active. With this, the output from the shift register of said one stage is always non-active when the output from the previous stage is carried out, so that the output signals from the previous stage and the next stage of the shift register are caused not to overlap each other with certainty.

Furthermore, the shift register of the present invention is arranged in such a manner that, assuming that M is an integer not less than 2, M types of clock signal source pulses whose phases are different to each other for a 1/M cycle are, instead of the clock signal, supplied to the flip-flops of the respective stages, at intervals of (M−1) stages.

According to this arrangement, M types of clock signals having phases different from each other for 1/M cycle are used, so that the clock frequency can be reduced to 1/M.

Adopting the aforesaid shift register to the drive circuit of the display device restrains the frequency to a low level, when the clock signal is supplied from an external circuit. Thus, the power consumption of the external circuit can be further reduced.

The shift register of the present invention is arranged in such a manner that, the phases of said M types of clock signal source pulses are arranged in such a manner that active periods of the clock signal source pulses do not overlap each other.

According to this arrangement, to cause the active periods of the output signals of neighboring shift registers not to overlap each other, the duty ratio between the M types of clock signals are set to be not more than 100×(1/M). This makes it possible to do away with the delay circuits after the circuit from which the output is supplied to the outside of the shift register.

For this reason, when the foregoing shift register is adopted to the drive circuit of the display device, the frame of the display device can be narrowed down by simplifying the circuit, while the sampling pulses are caused not to overlap each other. Furthermore, the widths of the pulses can be arbitrarily set by adjusting the aforesaid duty ratio.

The shift register of the present invention is arranged in such a manner that, from each of the stages, at least the level-shifted signal, which is either the clock signal or the inversion signal, is supplied to an outside of the shift register.

According to this arrangement, the clock signal which is stepped up/down by the level shifter is the signal which is supplied to the outside of the shift register, and hence the width of the signal outputted from the shift register is identical with the width of the shift register. The pulse width of this output signal is narrowed to the extent that the pulses do not overlap each other even if the output signal is blunted.

In this manner, the neighboring signals supplied to the outside of the shift register, the output signals being stepped up/down, are adjusted not to overlap each other.

The shift register of the present invention is arranged in such a manner that, from each of the stages, the output signal or the signal which is the inversion of the output signal is supplied to an outside of the flip-flop.

According to this arrangement, the timing at which the output signal from the flip-flop rises is determined in accordance with a signal such as an output signal from the level shifter, an output signal from another flip-flop, a signal from a circuit after the circuit supplying a signal to the outside of the shift register, and the like. With this, the width of the signal supplied to the outside of the shift register is adjusted to a desired length.

The display device of the present invention is arranged in such a manner that, at least one of the scanning signal line drive circuit or the data signal line drive circuit is formed on a substrate on which the pixels are formed.

According to this arrangement, the lines between the scanning signal line drive circuit and the pixels, and the lines between the data signal line drive circuit and the pixels are provided on one substrate, so that it is unnecessary to provide the lines outside of the substrate.

For this reason, even if the numbers of the scanning signal lines and the data signal lines increase, the number of the signal lines outside the substrate does not change, and no additional lines are required. With this, the manufacturing process is simplified, the unnecessary increase of capacity of the signal lines is prevented, and the decrease in the degree of integration is prevented.

The display device of the present invention is arranged in such a manner that, the scanning signal line drive circuit, the data signal line drive circuit, and the pixel areas include switching elements each made up of polycrystalline silicon thin-film transistors.

Polycrystalline silicon thin-film transistors are significantly inferior to single-crystal silicon thin-film transistors, in terms of performances as a transistor. That is, a threshold value is high, so that a drive voltage is also high. For this reason, a current-driven level shifter is required, causing such a big problem that a stationary current accounts for a large percentage of the power consumption. Furthermore, the stationary current causes the degradation of the transistor.

This stationary current can be significantly reduced by adopting a drive circuit adopting the shift register of the present invention, so that the above-described problem of the polycrystalline silicon thin-film transistor is significantly relieved.

The polycrystalline silicon thin-film transistor also has such a problem that, since the size of crystal of silicon is not uniform, the characteristics of transistors formed on one glass substrate are different to each other. In such a case, the intervals between the sampling pulses deviate, so that a lot of inverters in the delay circuit are required in order to suitably adjust the intervals between the sampling pulses, and these inverters occupy a large area.

In the meanwhile, in the present invention, appropriate intervals of the sampling pulses is obtained by utilizing the inferior characteristics of the polycrystalline thin-film transistor, i.e. utilizing the delay of the circuits. Thus, the drive circuit made of polycrystalline silicon can maximize the effects of the present invention.

The display device of the present invention is arranged in such a manner that, the scanning signal line drive circuit, the data signal line drive circuit, and the pixel areas include the switching elements manufactured at a process temperature not more than 600° C.

This manufacture at a process temperature not more than 600° C. indicates that transistors can be formed on an inexpensive glass substrate. transistors manufactured at a temperature not more than 600° C. are polycrystalline rather than single-crystal, so as to be inferior in characteristics. Moreover, being dissimilar to a silicon wafer, glass includes a lot of impurities, thereby deteriorating the performance of a transistor. For these reasons, the problem of power consumption cannot be resolved when such transistors is adopted to a typical drive circuit.

If, meanwhile, transistors formed on a glass substrate have characteristics enough to the operation of a shift register, forming drive circuits on one glass substrate is better than adhering the drive circuits onto the display panel made up of a glass substrate, because the contact failure between the drive circuits and the display panel can be prevented, and the size of the panel module can be reduced. Furthermore, since the drive circuits are formed in a process identical with that of transistors for pixels, the manufacturing costs can be reduced. Note that, however, being dissimilar to a silicon wafer, the glass substrate of the above-mentioned case is very large (one side is about several tens of centimeters to several hundreds of centimeters), and this induces the deterioration and fluctuation in the transistor performance, in terms of the process. Further, in the large-sized glass substrate, the load accompanied with the drive of the transistor is very heavy. Thus, the degree of the signal delay is high, the size of the transistor has to be large, and the performance of the shift register has to be improved in order to keep the delay to be within an acceptable range. As a result, the performance of a current-driven level shifter has to be improved, and a very large stationary current is required.

Thus, for significantly reducing such a stationary current, the drive circuit of the present invention exert maximum effects.

Alternatively, a shift register, which causes a signal supplied thereto to be in sync with a clock signal and serially transfers the clock signal to multi-stage flip-flops, includes blocks each including at least one of the flip-flops, each of the blocks including: a level shifter which level-shifts a clock signal whose amplitude of the voltage is narrower than a drive voltage of the flip-flop, and supplies the level-shifted signal to the flip-flop; and operation control means which controls a level shifter of the block in the next stage, with the help of the output from the level shifter and the output from the flip-flop.

According to this arrangement, when, for instance, a set-reset flip-flop which is set in accordance with a clock signal is adopted, the level shifter of the block is required to operate only when (i) the set-reset flip-flop of the block has been set, (ii) the set-reset flip-flop has not been reset, and (iii) the block outputs a shift output. Thus, the operation control means is provided in each block, so that the level shifter of the next stage is controlled using any one of the outputs from the foregoing shift registers and the output from the flip-flop.

With this, the level shifter of the block operates only during the minimum period for outputting the shift output from the block, so that the power consumption is reduced.

It is needless to say that the following alternatives may be adopted: each block includes one flip-flop and each flip-flop is provided with a level shifter, or a level shifter is provided for a plurality of flip-flops. Also, whether or not a pulse supplied to each block is transferred to the next block is determined in accordance with the output from the flip-flop of each block and the state of the output from each block.

The invention being thus described, it will be obvious that the same way may be varied in many ways. Such variations are not to be regarded as a departure from the spirit and scope of the invention, and all such modifications as would be obvious to one skilled in the art are intended to be included within the scope of the following claims.

What is claimed is:

1. A shift register comprising a plurality of stages each including:
   a flip-flop which is driven by a drive voltage higher than an amplitude of a clock signal, in order to serially transfer an input signal in sync with the clock signal;
   a level shifter which level-shifts the clock signal or an inversion signal which is an inversion of the clock signal, and supplies the level-shifted signal to the flip-flop; and
   a control circuits for controlling an operation time of the level shifter,
   at least an output signal or a signal which is an inversion of the output signal being supplied from the flip-flop of one stage to the control circuit of another stage, so that the input signal is serially transferred,
   in each of the stages, the control circuit controls the operation time of the level shifter to be shorter than a cycle of the clock signal, and
   wherein each control circuit respectively controls the operation time of the respective level shifters to be shorter than the cycle of the clock signal, and the control circuit for controlling the operation time of a given stage has an input directly connected to an output of the flip-flop of the previous stage.

2. The shift register as defined in claim 1, wherein, the level shifter includes a current-driven step-up transformer and/or a current-driven step-down transformer, which cause(s) an input switching element to which the clock signal is supplied to always turn on, when the level shifter is in operation.

3. The shift register as defined in claim 1, wherein, the level shifter includes output stabilizing means which keeps a predetermined output voltage during a period in which the level shifter is stopped.

4. The shift register as defined in claim 1, wherein, in each of the stages, the control circuit causes the level-shifted signal from the level shifter to rise after start of the operation period of the level shifter.

5. The shift register as defined in claim 1, wherein, assuming that M is an integer not less than 2, M types of clock signal source pulses whose phases are different to each other for a 1/M cycle are, instead of the clock signal, supplied to the flip-flops of the respective stages, at intervals of (M−1) stages.

6. The shift register as defined in claim 5, wherein, the phases of said M types of clock signal source pulses are arranged in such a manner that active periods of the clock signal source pulses do not overlap each other.

7. The shift register as defined in claim 1, wherein, from each of the stages, at least the level-shifted signal, which is either the clock signal or the inversion signal, is supplied to an outside of the shift register.

8. The shift register as defined in claim 1, wherein, from each of the stages, the output signal or the signal which is the inversion of the output signal is supplied to an outside of the flip-flop.

9. A display device comprising:
   scanning signal lines;
   data signal lines orthogonal to the respective scanning signal lines; and a scanning signal line drive circuit and a data signal line drive circuit which write video signals to pixel areas via the scanning signal lines and the data signal lines, respectively, so that an image is displayed, at least one of the scanning signal line drive circuit and the data signal line drive circuit including a shift register which serially transfers supplied signals to multi-stage flip-flops, in accordance with a clock signal, the shift register comprising a plurality of stages each including:

a flip-flop which is driven by a drive voltage higher than an amplitude of a clock signal, in order to serially transfer an input signal in sync with the clock signal;

a level shifter which level-shifts the clock signal or an inversion signal which is an inversion of the clock signal, and supplies the level-shifted signal to the flip-flop; and a control circuits for controlling an operation time of the level shifter, at least an output signal or a signal which is an inversion of the output signal being supplied from the flip-flop of one stage to the control circuit of another stage, so that the input signal is serially transferred, and in each of the stages, the control circuit controls the operation time of the level shifter to be shorter than a cycle of the clock signal, and wherein each control circuits respectively controls the operation time of the respective level shifters to be shorter than the cycle of the clock signal, and the control circuit for controlling the operation time of a given stage has an input directly connected to an output of the flip-flop of the previous stage.

10. The display device as defined in claim 9, wherein, at least one of the scanning signal line drive circuit and the data signal line drive circuit is formed on a substrate on which the pixel areas are formed.

11. The display device as defined in claim 9, wherein, the scanning signal line drive circuit, the data signal line drive circuit, and the pixel areas include switching elements each made up of polycrystalline silicon thin-film transistors.

12. The display device as defined in claim 11, wherein, the scanning signal line drive circuit, the data signal line drive circuit, and the pixel areas include the switching elements manufactured at a process temperature not more than 600° C.

13. A shift register comprising a plurality of stages each including:

a flip-flop which is driven by a drive voltage higher than an amplitude of a clock signal, in order to serially transfer an input signal in sync with the clock signal;

a level shifter which level-shifts the clock signal or an inversion signal which is an inversion of the clock signal, and supplies the level-shifted signal to the flip-flop; and a control circuit for controlling an operation time of the level shifter, a level shifted signal from the level shifter of one stage being supplied to the control circuit of another stage, at least an output signal or a signal which is an inversion of the output signal being supplied from the flip-flop of one stage to the control circuit of another stage, so that the input signal is serially transferred, and in each of the stages, the control circuit controls the operation time of the level shifter to be shorter than a cycle of the clock signal, and wherein each control circuits respectively control the operation time of the respective level shifters to be shorter than the cycle of the clock signal, and the control circuit for controlling the operation time of a given stage has an input directly connected to an output of the flip-flop of the previous stage.

14. A display device comprising:

scanning signal lines;

data signal lines orthogonal to the respective scanning signal lines; and a scanning signal line drive circuit and a data signal line drive circuit which write video signals to pixel areas via the scanning signal lines and the data signal lines, respectively, so that an image is displayed, at least one of the scanning signal line drive circuit and the data signal line drive circuit including a shift register which serially transfers supplied signals to multi-stage flip-flops, in accordance with a clock signal, the shift register comprising a plurality of stages each including:

a flip-flop which is driven by a drive voltage higher than an amplitude of a clock signal, in order to serially transfer an input signal in sync with the clock signal;

a level shifter which level-shifts the clock signal or an inversion signal which is an inversion of the clock signal, and supplies the level-shifted signal to the flip-flop; and a control circuits for controlling an operation time of the level shifter, a level shifted signal from the level shifter of a given stage being supplied to the control circuit of another stage, at least an output signal or a signal which is an inversion of the output signal being supplied from the flip-flop of one stage to the control circuit of another stage, so that the input signal is serially transferred, and in each of the stages, the control circuit controls the operation time of the level shifter to be shorter than a cycle of the clock signal, and wherein each control circuits respectively control the operation time of the respective level shifters to be shorter than the cycle of the clock signal, and the control circuit for controlling the operation time of a given stage has an input directly connected to an output of the flip-flop of the previous stage.

* * * * *